US012578375B2

(12) United States Patent
Ball et al.

(10) Patent No.: US 12,578,375 B2
(45) Date of Patent: Mar. 17, 2026

(54) ARC FAULT DETECTION USING CURRENT SIGNAL DEMODULATION, OUTLIER ELIMINATION, AND AUTOCORRELATION ENERGY THRESHOLDS

(71) Applicants: MERSEN USA EP Corp., Boonton, NJ (US); Northeastern University, Boston, MA (US)

(72) Inventors: Roy A. Ball, Coral Springs, FL (US); Jonathan C. Kim, Brighton, MA (US); Bradley M. Lehman, Belmont, MA (US)

(73) Assignee: MERSEN USA EP CORP., Boonton, NJ (US)

( * ) Notice: Subject to any disclaimer, the term of this patent is extended or adjusted under 35 U.S.C. 154(b) by 256 days.

(21) Appl. No.: 18/136,612

(22) Filed: Apr. 19, 2023

(65) Prior Publication Data

US 2023/0400500 A1 Dec. 14, 2023

Related U.S. Application Data

(60) Provisional application No. 63/332,431, filed on Apr. 19, 2022.

(51) Int. Cl.
*G01R 31/12* (2020.01)
*H02S 50/00* (2014.01)

(52) U.S. Cl.
CPC .............. *G01R 31/12* (2013.01); *H02S 50/00* (2013.01)

(58) Field of Classification Search
None
See application file for complete search history.

(56) References Cited

U.S. PATENT DOCUMENTS

| | | | | |
|---|---|---|---|---|
| 2005/0017731 A1* | 1/2005 | Zuercher | .............. | H02H 1/0015 |
| | | | | 324/536 |
| 2012/0098672 A1* | 4/2012 | Restrepo | .............. | H02H 1/0015 |
| | | | | 340/815.45 |
| 2012/0316804 A1* | 12/2012 | Oberhauser | ........ | G01R 31/1227 |
| | | | | 702/58 |
| 2015/0381111 A1* | 12/2015 | Nicolescu | ............ | H02H 1/0015 |
| | | | | 324/761.01 |
| 2016/0336731 A1* | 11/2016 | Parker | .................... | H02H 3/162 |
| 2018/0097354 A1* | 4/2018 | Yoscovich | ................ | H02J 3/38 |

OTHER PUBLICATIONS

Extended European Search Report issued in related European Patent Application No. 23168218.8 dated Sep. 18, 2023.
Kim, Jonathan C., et al., "A Series DC Arc Fault Detection Algorithm Based on PV Operating Characteristics and Detailed Extraction of Pink Noise Behavior", 2021 IEEE Applied Power Electronics Conference and Exposition (APEC), IEEE, (Jun. 14, 2021), pp. 989-994.
Kim, Jonathan C., et al., "Series PV Arc Fault Detection using Current Demodulation and Autocorrelation Coefficients", 2022 IEEE Energy Conversion Congress and Exposition (ECCE), IEEE, (Oct. 9, 2022), pp. 107.

* cited by examiner

*Primary Examiner* — Nasima Monsur
(74) *Attorney, Agent, or Firm* — RENNER, OTTO, BOISSELLE & SKLAR, LLP

(57) ABSTRACT

A series PV arc fault detection method and apparatus demodulates a current signal provided by a DC power source to an inverter to eliminate a DC component and periodic noise. Autocorrelation coefficients are generated from the demodulated current signal to monitor noise energy and variation and, based on the noise energy, a determination is made if an arc fault has occurred.

18 Claims, 21 Drawing Sheets

POTENTIAL DETECTION FLAGS

ARC FAULT DETECTION SIGNAL

NO FALSE ALARMS

ARC FAULT IGNITION

ARC FAULT SUSTAINED

POTENTIAL INTERMITTENT ARCS

ARC FAULT DETECTION USING CURRENT SIGNAL DEMODULATION, OUTLIER ELIMINATION, AND AUTOCORRELATION ENERGY THRESHOLDS

RELATED APPLICATION DATA

This application claims priority of U.S. Provisional Application No. 63/332,431 filed on Apr. 19, 2022, which is incorporated herein by reference in its entirety.

FIELD OF THE INVENTION

The invention relates generally to arc faults, and in particular, to methods and systems for detecting arc faults in photovoltaic systems.

BACKGROUND OF THE INVENTION

DC arc faults in photovoltaic (PV) systems are a dangerous category of faults often leading to fires and irreversible damage to system components. The large range of potential unwanted tripping scenarios has made it difficult for arc fault detection devices (AFDD) to correctly identify arc faults and avoid false alarms. Specifically, series DC arc faults are the most common, especially as the PV cables, connectors, and conductors deteriorate in aging PV installations and can be missed by over-current protection devices.

Traditionally, DC arc fault algorithms relied heavily on frequency domain analysis of the current signal. A Fast Fourier Transform (FFT) or similar method is used to measure the power of the frequency spectrum in the arcing frequency bandwidth (1 Hz to 100 kHz). However, these methods do not distinguish the shape or color of the increase in power at these frequencies. Therefore, unwanted tripping may occur when there is a sudden increase in noise by another source in this arcing frequency bandwidth. Discrete Wavelet Transforms (DWT)-based algorithms attempt to utilize both the time and frequency domains of the current signal by analyzing the magnitude change of the current signal during an arc fault as an extra layer of detection criteria to sort through arc-like noisy sources.

Statistical methods involving entropy or special exponents, such as the Hurst exponent, attempt to determine the type of noise injected into the system by measuring the variance or change in the noise energy. However, these methods depend on previous knowledge of the PV system to minimize switching frequencies through filtering. Machine learning algorithms classify and differentiate arc fault behavior from other transients by collecting a large number of training data of real arc fault tests. However, the random nature of different arc fault environments and dependence on the specific PV system configuration may sometimes cause false alarms. Causes of these unwanted tripping events may include: (i) electromagnetic interference (EMI); (ii) sudden changes in the load, PV array or inverter operation; (iii) switching noise from power electronic devices; (iv) AC noise coupled to the DC side of a transformerless inverter; and (v) unexpected PV configurations.

Recent research has proposed that to make AFDD more robust to false alarms. It is beneficial to incorporate algorithms based on multiple detection features. For example, Y. Gao, J. Zhang, Y. Lin and Y. Sun ("An innovative photovoltaic DC arc fault detection method through multiple criteria algorithm based on a new arc initiation method," 2014 IEEE 40th Photovoltaic Specialist Conference (PVSC), Denver, CO, USA, 2014, pp. 3188-3192) develop three time domain characteristics and three separate frequency domain characteristics, each individually not unique to an arc fault, in their AFDD.

SUMMARY OF THE INVENTION

In accordance with aspects of the invention, disclosed is a series PV arc fault detection method and apparatus that provide enhanced arc fault detection. In accordance with aspects of the invention, a current signal provided by a PV array to an inverter is demodulated to eliminate a DC component and periodic noise. Autocorrelation coefficients are generated from the demodulated current signal to monitor noise energy and variation and accurately determine the shape of pink noise in the frequency spectrum. Outliers in the energy can be eliminated to protect against false alarms, and computed energy signals are compared against thresholds. The presence of an arc fault is then determined based on the comparison. Advantageously, the detection method does not need previous knowledge of switching frequency, and has the potential to detect intermittent arcs.

According to one aspect of the invention, a method for detecting arc faults in direct current (DC) power system connected to a load is provided, wherein a current sensor is electrically connected to the DC power system and operative to measure a current supplied to the load. The method comprises: measuring, using the current sensor, a current output by the DC power system over the prescribed time period to obtain a measured data set of current measurements; demodulating the measured data set of current measurements to produce a demodulated current data set; comparing noise energy in the demodulated current data set to a threshold value; and outputting an arc fault flag when the comparison satisfies a prescribed criterion.

In one embodiment, the step of demodulating the measured current produces a demodulated current data set that is independent of a switching frequency of the power system.

In one embodiment, the step of demodulating the measured current removes a DC component and switching noise from the measured data set.

In one embodiment, demodulating the measured data set of current measurements comprises: time-shifting the measured data set of current measurements by a prescribed time period; and subtracting the time-shifted data set from the measured data set of current measurements to obtain a differenced data set of current measurements.

In one embodiment, the method further includes: obtaining a standard deviation of the differenced data set of current measurements; comparing the standard deviation of the differenced data set of current measurements to a previously obtained standard deviation of current measurements; and setting a point in the demodulated current data set equal to the standard deviation of the differenced data set of current measurements when the standard deviation of the differenced data set of current measurements is less than the previously-obtained standard deviation of the differenced data set of current measurements.

In one embodiment, the method includes increasing the prescribed time period, and repeating the method for a predetermined number of iterations.

In one embodiment, outputting the arc fault flag includes one of outputting a visual indicator of the arc fault or an audible indication of the arc fault.

According to another aspect of the invention, an arc fault detection device for detecting arc faults in direct current (DC) power system connected to a load includes:

logic configured to obtain a measurement of a current output by the DC power system over a prescribed time period to obtain a measured data set of current measurements;

logic configured to demodulate the measured data set of current measurements to produce a demodulated current data set; logic configured to compare noise energy in the demodulated current data set to a threshold value; and logic configured to output an arc fault flag when the comparison satisfies a prescribed criterion.

In one embodiment, the logic configured to demodulate includes logic configured to demodulate the measured current to produce a demodulated current data set that is independent of a switching frequency of the power system.

In one embodiment, the logic configured to demodulate the measured current includes logic configured to remove a DC component and switching noise from the measured data set.

In one embodiment, the logic configured to demodulate the measured data set of current measurements comprises: logic configured to time-shift the measured data set of current measurements by a prescribed time period; and logic configured to subtract the time-shifted data set from the measured data set of current measurements to obtain a differenced data set of current measurements.

In one embodiment, the device includes: logic configured to obtain a standard deviation of the differenced data set of current measurements; logic configured to compare the standard deviation of the differenced data set of current measurements to a previously obtained standard deviation of current measurements; and logic configured to set a point in the demodulated current data set equal to the standard deviation of the differenced data set of current measurements when the standard deviation of the differenced data set of current measurements is less than the previously-obtained standard deviation of the differenced data set of current measurements.

In one embodiment, the logic configured to output the arc fault flag comprises one of logic configured to output a visual indicator of the arc fault or logic configured to output an audible indication of the arc fault.

In one embodiment, the device is integrated within one of a power supply, a circuit disconnect device, or a circuit protection device.

In one embodiment, the device is integrated in a power supply comprising an inverter.

In one embodiment, the device is integrated in a circuit disconnect device comprising a switch.

In one embodiment, the device is integrated in a circuit disconnect device in the form of a circuit breaker.

According to another aspect of the invention, provided is a non-transitory computer-readable medium comprising computer-executable instructions that, when executed by a processor, cause the processor to carry out the method described herein.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The invention may take physical form in certain parts and arrangement of parts, an embodiment of which is described in detail in the specification and illustrated in the accompanying drawings, wherein.

DETAILED DESCRIPTION OF THE INVENTION

Figure 1A:
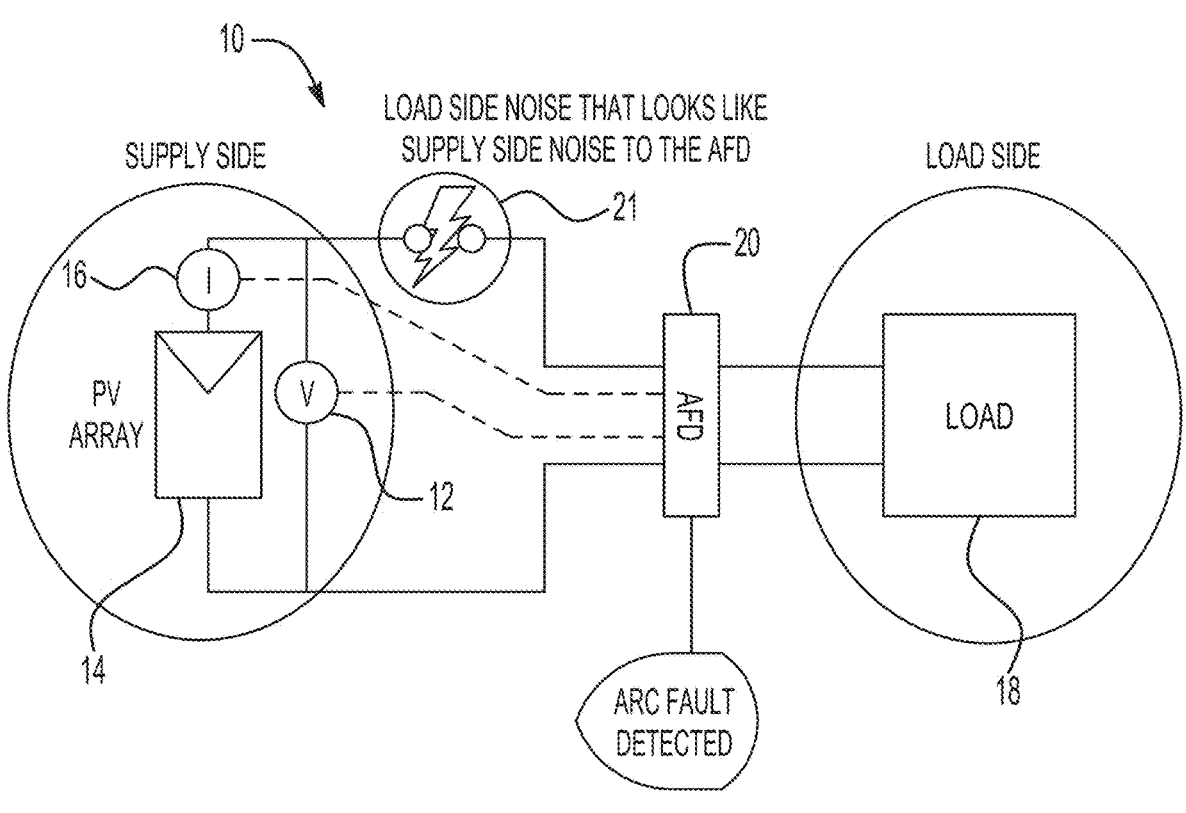
FIG. 1A illustrates an exemplary PV circuit in which arc faults may occur, the circuit including an arc fault detection apparatus in accordance with the invention.

Embodiments of the present invention will now be described with reference to the drawings, wherein like reference numerals are used to refer to like elements throughout. It will be understood that the figures are not necessarily to scale.

The present invention was developed in the context of PV array power systems and therefore will be described chiefly in this context. However, aspects of the invention have utility in other power systems that utilize DC power, such as power systems that employ an array of batteries as the power source. Further, the invention is described generally as an arc fault detector for use in a power system. Such arc fault detector may be a stand-alone device that is added to a power system, or it may be incorporated into another device used in the power system. For example, the arc fault detector functionality may be integrated within an inverter, a disconnect switch, or a circuit protection device.

Arc faults act as an additional load-side noise on a PV array. However, the arc fault occurs on the supply side of the arc fault detector (AFD). Therefore, although arc faults act as load-side noise, they behave like supply-side noise from the point of view of the AFD. This is illustrated in FIG. 1A, which shows an exemplary system 10 for detecting arc faults. The system includes a voltage sensor 12 that measures a voltage output by a PV array 14, and a current sensor 16 that measures a current output by the PV array 14. A load 18, which in the illustrated example includes an inverter for converting DC power to AC power, as well as the device(s) that receive the AC power, is connected to the PV array 14 to receive power therefrom, and an AFD 20 is connected between the PV array 14 and the load 18 and operative to detect arc faults 21. The voltage sensor 12 and current sensor 16 are operatively coupled to the AFD 20 to provide the measured voltage and current thereto. The AFD 20 can be in the form of a dedicated hardware circuit and/or can include a processor, memory, and code stored in the memory and executable by the processor. The AFD 20 analyzes the measured data as discussed in more detail below to determine if an arc fault is occurring. If an arc fault is detected, appropriate action can be taken.

The exemplary methods discussed herein may be carried out by the AFD 20. In this regard, the AFD may execute logic embodied as a hardware circuit or as a set of logical instructions that are executable by a processor. Therefore, the methods may be embodied as a hardware circuit or as software in the form of a computer program that is stored on a computer readable medium, such as a memory.

Figure 1B:
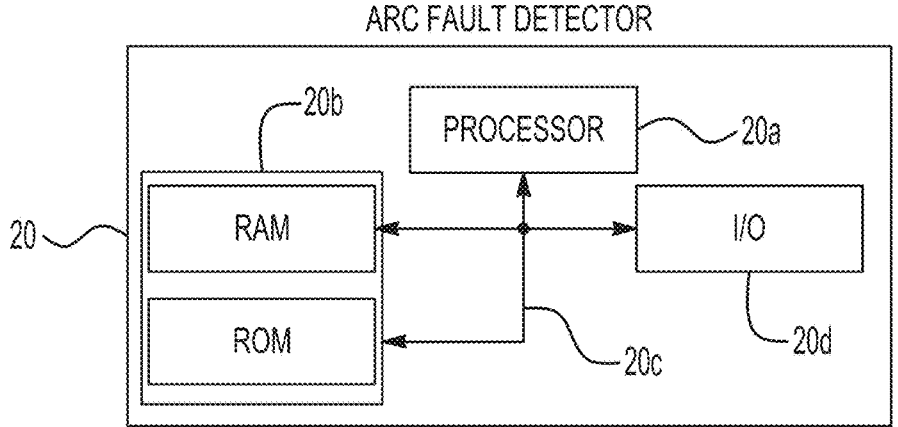
FIG. 1B is a simple block diagram of an exemplary arc fault detector.

Referring briefly to FIG. 1B, illustrated is a block diagram of an exemplary AFD 20 according to one embodiment of the invention. The AFD 20 includes a processor 20a, such as a central processing unit (CPU), microcontroller or microprocessor, and memory 20b that is configured to carry out overall control of the functions and operations of the AFD 20. The processor 20a executes code stored in memory 20b in order to carry out operation of the AFD 20. For instance, the processor 20a may execute code stored in memory 20b that implements the arc detection function as described herein. The memory 20b may be, for example, one or more of a buffer, a flash memory, a hard drive, a removable media, a volatile memory, a non-volatile memory, a random access memory (RAM), a read-only memory (ROM), or other suitable device. In a typical arrangement, the memory 20b may include a read-only memory for storage of instructions to be executed by the processor 20a, non-volatile memory for long-term data storage and a volatile memory that functions as system memory for the processor 20a. The memory 20b may exchange data with the processor 20a over a data bus 20c. Accompanying control lines and an address bus between the memory 20b and the processor 20a also may be present.

The AFD 20 may further include one or more input/output (I/O) interface(s) 20d. The I/O interface(s) 20d may be in the form of typical I/O interfaces and may include one or more electrical connectors, USB connectors, etc. The I/O interface(s) 20d may form one or more data ports for connecting the AFD 20 to another device (e.g., a computer) or to a sensor, such as voltage sensor 12 and current sensor 16 via a cable (not shown). Further, operating power may be received over the I/O interface(s) 20d. While the embodiment of FIG. 1B is illustrated as including a processor that executes instructions, other embodiments are possible. For example, the AFD 20 may be embodied as a hardware device that includes a dedicated circuit and/or an application-specific integrated circuit (ASIC).

Figure 2:
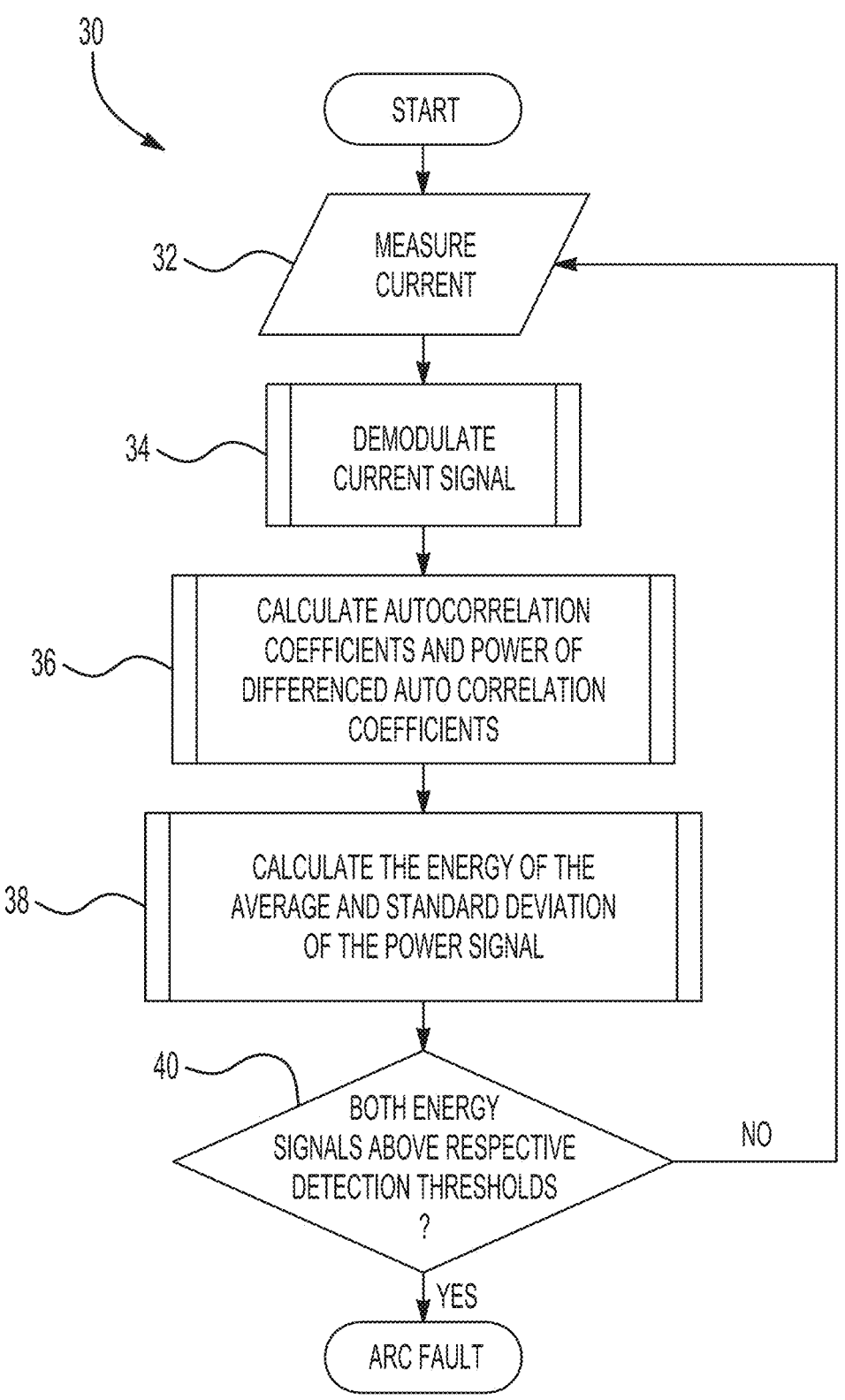
FIG. 2 is a flow chart illustrating exemplary steps of a method for detecting arc faults in accordance with the invention.

Moving to FIG. 2, illustrated is a flow chart detailing steps of an exemplary method 30 for detecting arc faults in accordance with an embodiment of the invention. Beginning at step 32, the AFD 20, via the current sensor 16, measures current provided by the PV array 14 to the inverter 18 over a predefined window (e.g., a signal window of 500$p$) to produce a current waveform for that window. Next at step 34 the AFD 20 demodulates the measured current for the window. The demodulation process eliminates a DC component in the measured current signal, and also eliminates periodic signals, such as switching noise, in the measured current signal. The demodulation process also detrends the current data, which flattens the data points. Further details on the demodulation process are discussed below with respect to FIG. 6.

Next at step 36 autocorrelation coefficients are calculated for the window and compared to autocorrelation coefficients of a previously measured current window to obtain differenced autocorrelation coefficients. A power of the differenced autocorrelation coefficients then is calculated to quantify the autocorrelation coefficients. As discussed in further detail below, outliers in the power signals may be identified and eliminated to avoid false alarms. The autocorrelation coefficients and their power values enable detection of long-term memory in the current signal (i.e., pink noise), as well as variations in the circuit parameters (e.g., changing impedance of arc fault over time). Details for performing the autocorrelation step 36 are discussed below with respect to FIG. 8.

Next at step 38 the energy of the average of the power signal and the energy of the standard deviation of the power signal are calculated. The calculated energies can be used to monitor the consistency of the power signals obtained in step 36 over time. At step 40 the energy of the average of the power signal and the energy of the standard deviation of the power signal are compared against detection thresholds to determine if an arc fault has occurred. If one of the energy signals is not above the threshold, then an arc fault has not occurred and the method moves back to step 32 and repeats. However, if both energy signals are above the threshold, then it is concluded an arc fault has occurred.

Demodulation

Figures 3A, 3B, 4A, 4B:
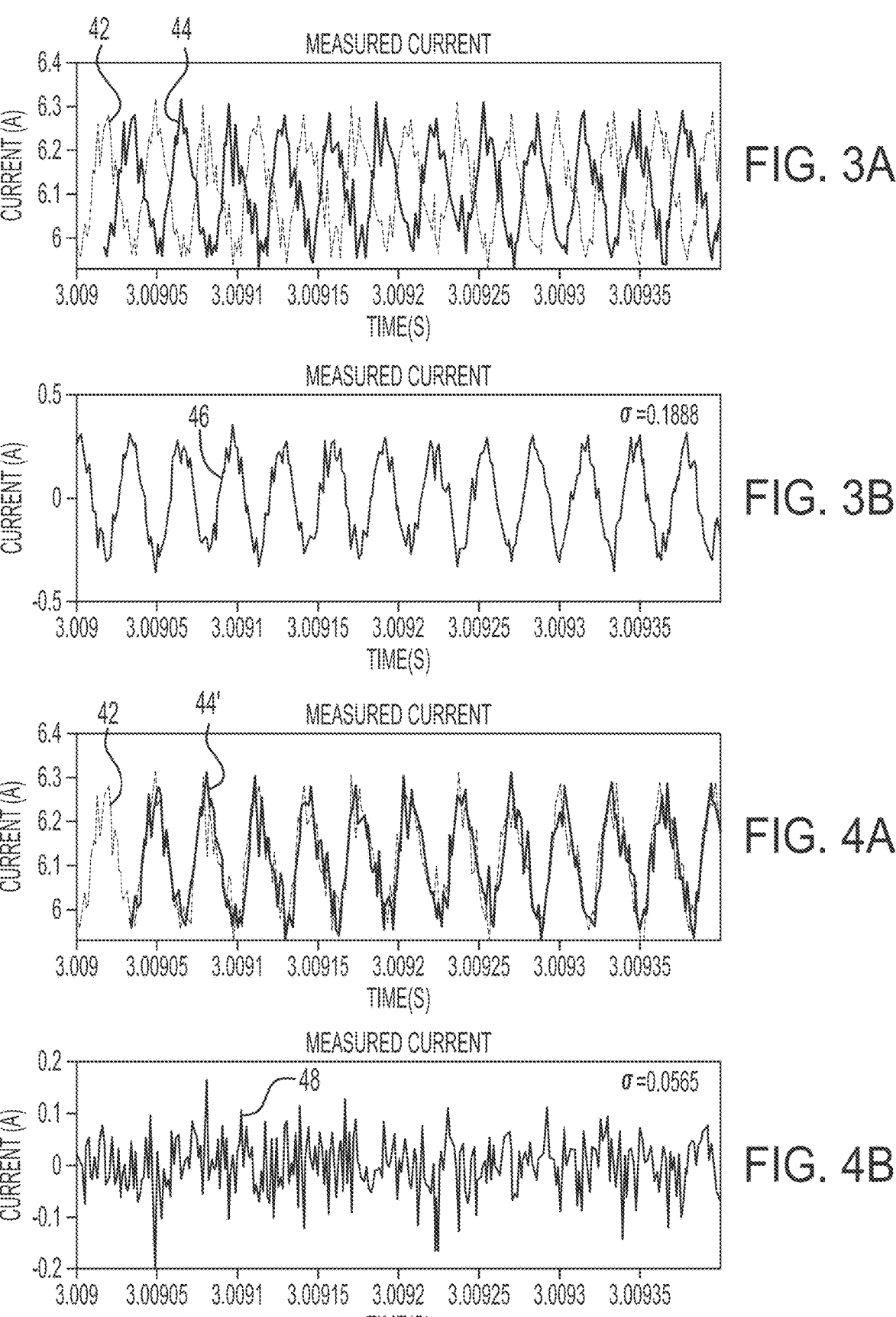
FIG. 3A illustrates a measured current waveform from a PV array along with a time-shifted version of the same current waveform.
FIG. 3B illustrates a waveform resulting when the time-shifted waveform of FIG. 3A is subtract from the original waveform of FIG. 3A.
FIG. 4A illustrates the measured current waveform of FIG. 3A along with another time-shifted version of the same current waveform of FIG. 3A.
FIG. 4B illustrates a waveform resulting when the time-shifted waveform of FIG. 4A is subtracted from the original waveform of FIG. 4A.

FIGS. 3A, 3B, 4A and 4B graphically illustrate the demodulation process. In FIG. 3A, a current waveform 42 for a measurement window is shown along with a time-shifted version 44 of the same current waveform. The current waveform 42 may be represented by Eq. 1, $$i(t) = i_{sf}(t) + i_n(t) + i_{Dc}(t) \qquad \text{Eq. 1}$$

where i(t) is the current waveform 42, $i_{sf}(t)$ is the current due to the switching frequency, $i_n(t)$ is the current due to noise, and $i_{DC}(t)$ is the DC value of the current, and t is the sample index within the window k. Eq. 1 may be rewritten as Eq. 2, $$i(t) = A * \sin(2\pi f_s t) + i_n(t) + i_{DC}(t) \qquad \text{Eq. 2}$$

where $f_s$ is the switching frequency of the inverter 18, and A is a coefficient representing the peak switching frequency current. The time-shifted waveform then may be represented by Eq. 3, $$i(t+\Delta t) = A * \sin(2\pi f_s(t+\Delta t)) + i_n(t+\Delta t) + i_{DC}(t+\Delta t) \qquad \text{Eq. 3}$$

where $\Delta t$ is the time shift. The current signal of Equation 2 then is subtracted by a time-shifted version of itself as shown in Eq. 4.

$$i(t) - i(t+\Delta t) = A * \sin(2\pi f_s t) - \qquad \text{Eq. 4}$$
$$A * \sin(2\pi f_s(t+\Delta t)) + i_{DC}(t) - i_{DC}(t+\Delta t) + i_n(t) - i_n(t+\Delta t)$$

FIG. 3B illustrates a difference between the original current waveform 42 and the time-shifted current waveform 44. As can be seen in FIG. 3B, the resulting difference waveform 46, due to switching noise still being present, remains sinusoidal. Also, the difference waveform 46 has a standard deviation of 0.1888, and this relatively large standard deviation is due to the non-perfect shift of the current waveform (i.e. the time-shifted waveform 44 is out of phase with the original waveform 42).

Moving to FIG. 4A, illustrated again is the original waveform 42 along with a time-shifted waveform 44', where the time-shifted waveform 44' is shifted such that it aligns with the current waveform 42. As a result, when the difference between the original current waveform 42 and the time-shifted current waveform 44' is obtained a much flatter signal 48 is produced, as seen in FIG. 4B. This flatter signal is also reflected by the relatively smaller standard deviation of 0.0565. The standard deviation of the demodulated signal is minimized when the shift is equivalent to 360 degree phase shift of the switching frequency and is maximized when the shift is equivalent to 180 degree phase shift of the switching frequency.

A time shift equal to a multiple of 360 degrees of the switching frequency isolates and eliminates the switching frequency. Also, differencing at 360 degrees eliminates the DC signal because the DC signals of each waveform are substantially the same when the time shift is relatively small. Importantly, pink noise is independent of the time shift and identically distributed (i.i.d.). Therefore, pink noise subtracted by a delayed version of itself does not deconstruct the stochastic signal, and the current waveform can be simplified as given by Eq. 5.

$$i(t) - i(t+\Delta t) = 0 + 0 + i'_n(t) = i'_n(t) \qquad \text{Eq. 5}$$

Figure 5:
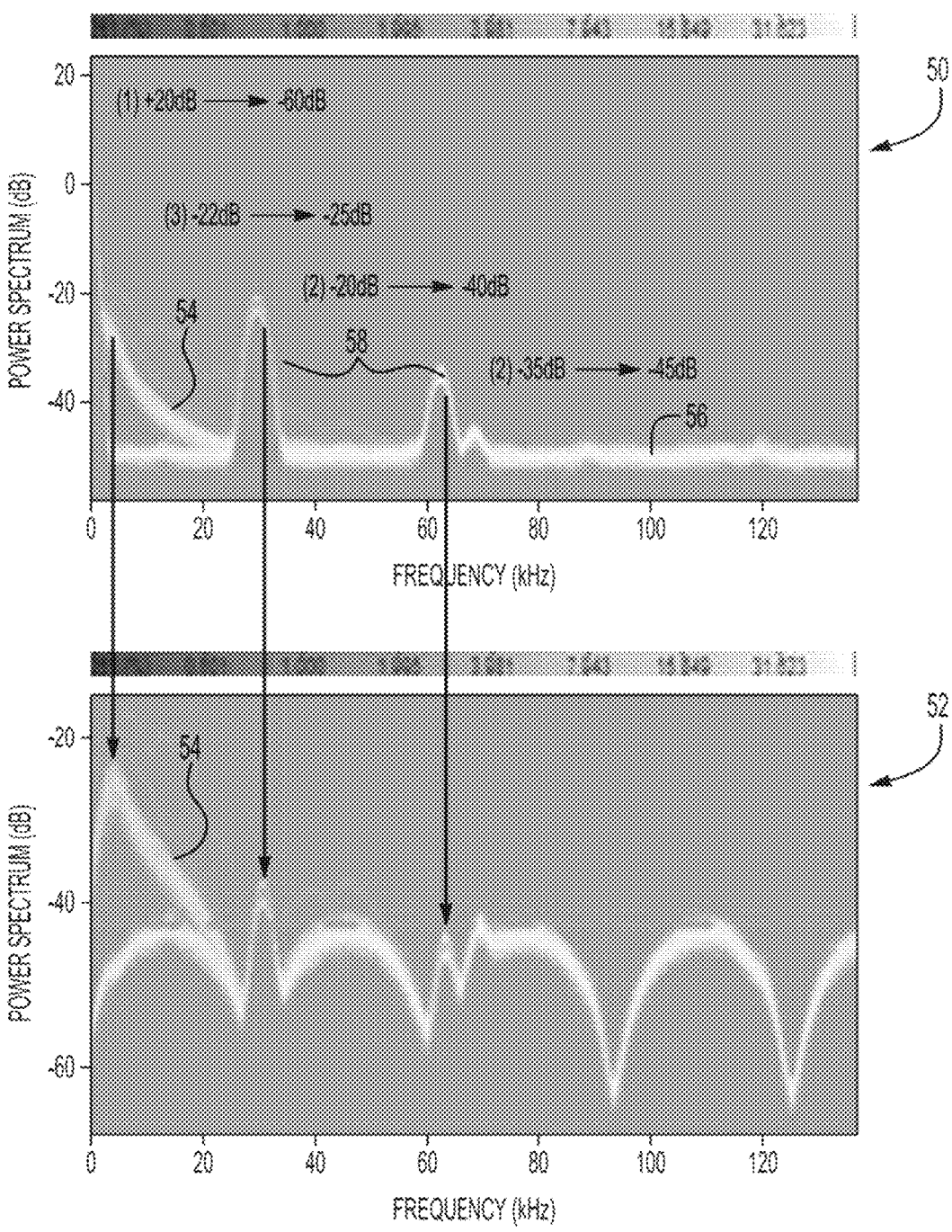
FIG. 5 illustrates two charts, the top chart showing a power spectrum of the original current waveform signal and the bottom chart showing a power spectrum of the original signal after demodulation.

The above characteristics are illustrated in FIG. 5, where the top graph shows a power spectrum of the original signal 50 and the bottom graph shows a power spectrum of the original signal after demodulation (the demodulated signal 52). The original signal 50 includes pink noise 54, a DC signal 56 and switching noise 58. When the standard deviation of the demodulated signal is minimized and the phase shift is greater than 1, the pink noise stochastic process is still present in the demodulated signal 54 and can be defined by Eq. 6

$$i(t) - i(t+\Delta t) = A * \sin(2\pi f_s t) - \qquad \text{Eq. 6}$$
$$A * \sin(2\pi f_s(t+\Delta t)) + i_{DC}(t) - i_{DC}(t+\Delta t) + i_n(t) - i_n(t+\Delta t)$$

However, the DC signal is effectively removed, while the switching noise and its harmonics are decreased to substantially the baseline noise, as can be seen in the demodulated signal 52 of FIG. 5.

Figure 6:
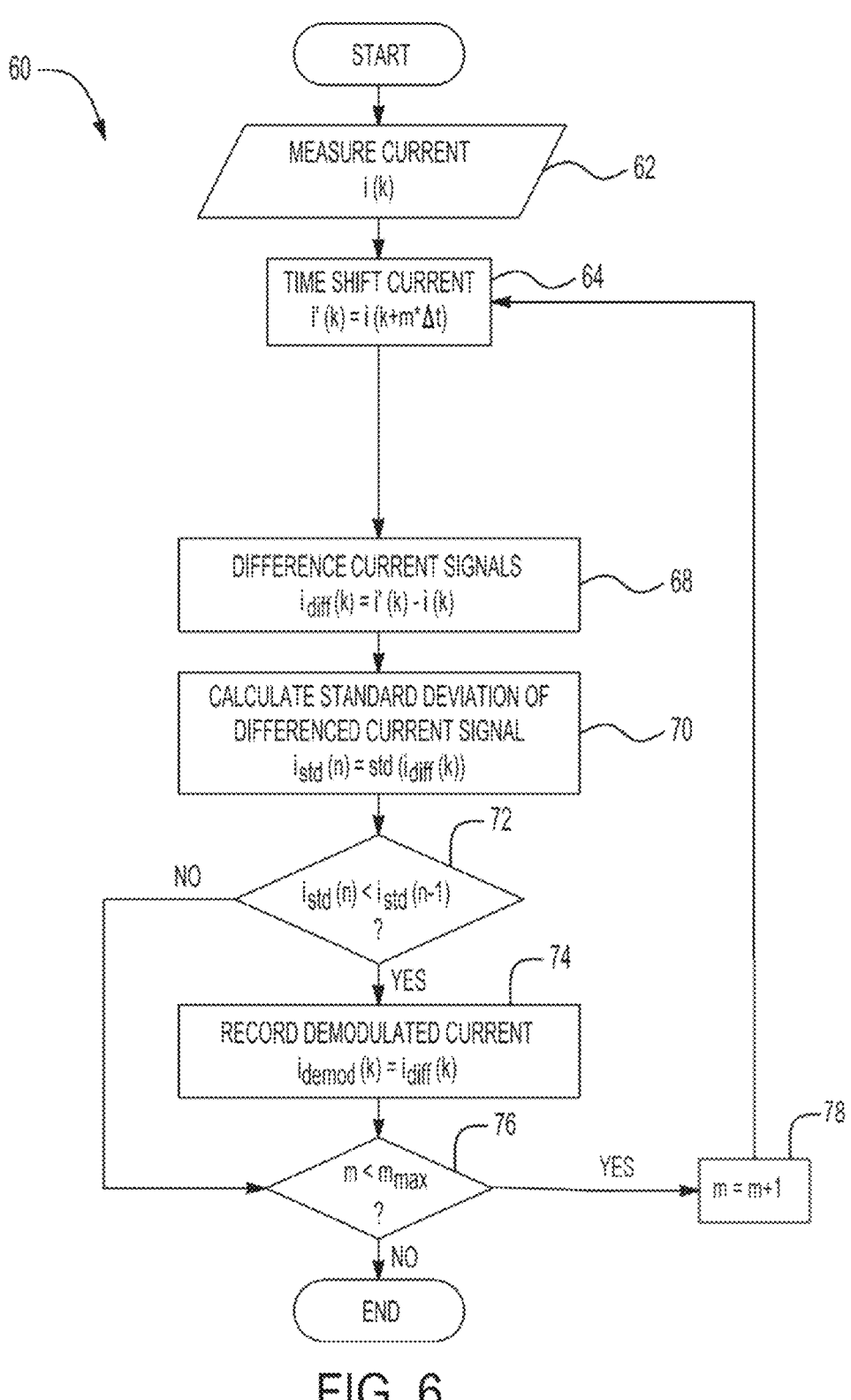
FIG. 6 is a flow chart illustrating exemplary steps of a method for demodulating the measured current in accordance with the invention.

Referring now to FIG. 6, provided is a flow chart illustrating an exemplary method for demodulating the current signal in accordance with the invention. Beginning at step 62, the AFD 20, via the current sensor 16, obtains a current signal measurement i(k) for a sampled window "k", and at step 64 the measured current signal is time shifted using Eq. 7 to obtain i'(k).

$$i'(k) = i(k + m * \Delta t) \qquad \text{Eq. 7}$$

where k refers to an index of the sampled window having samples $t_1$-$t_s$, and m*$\Delta$t is the total time shift, m being an integer (initially set to 1) and $\Delta$t being an amount of time. Next at step 68 a difference is obtained between the most-recent time-shifted current signal i'(k) and the most recent current signal i(k) to produce $i_{diff}$(k) for the window as shown in Eq. 8.

$$i_{diff}(k)=i'(k)-i(k) \qquad \text{Eq. 8}$$

At step 70 the standard deviation $i_{std}$(n) of the differential current signal $i_{diff}$(k) obtained in step 68 is calculated using Eq. 9, where "std" refers to a standard deviation function. At step 72 the calculated standard deviation $i_{std}$(n) obtained in step 70 is compared to the previously calculated standard deviation $i_{std}$(n–1), where n is an index used to distinguish the various standard deviation values.

$$i_{std}(n)=std(i_{diff}(k)) \qquad \text{Eq. 9}$$

If the calculated standard deviation $i_{std}$(n) is less than the previously-calculated standard deviation $i_{std}$(n–1), then the method moves to step 74 where the demodulated current $i_{demod}$(k) is recorded such that $i_{demod}$(k) is set equal to $i_{diff}$(k). The method then moves to step 76. Moving back to step 72, if the calculated standard deviation $i_{std}$(n) is not less than the previously calculated standard deviation $i_{std}$(n–1), then the method bypasses step 74 and moves directly to step 76.

At step 76, the AFD 20 checks counter m to determine if a desired number of iterations of the method have been performed and, if the desired number of iterations have not been performed the method moves to step 78 where the counter m is incremented and then the method moves back to step 64 and repeats. The effect of increasing the counter m is that during the next iteration the time shift is increased (more lag is introduced). Moving back to step 76, if the desired number of iterations have been performed then the method ends.

Figure 7:
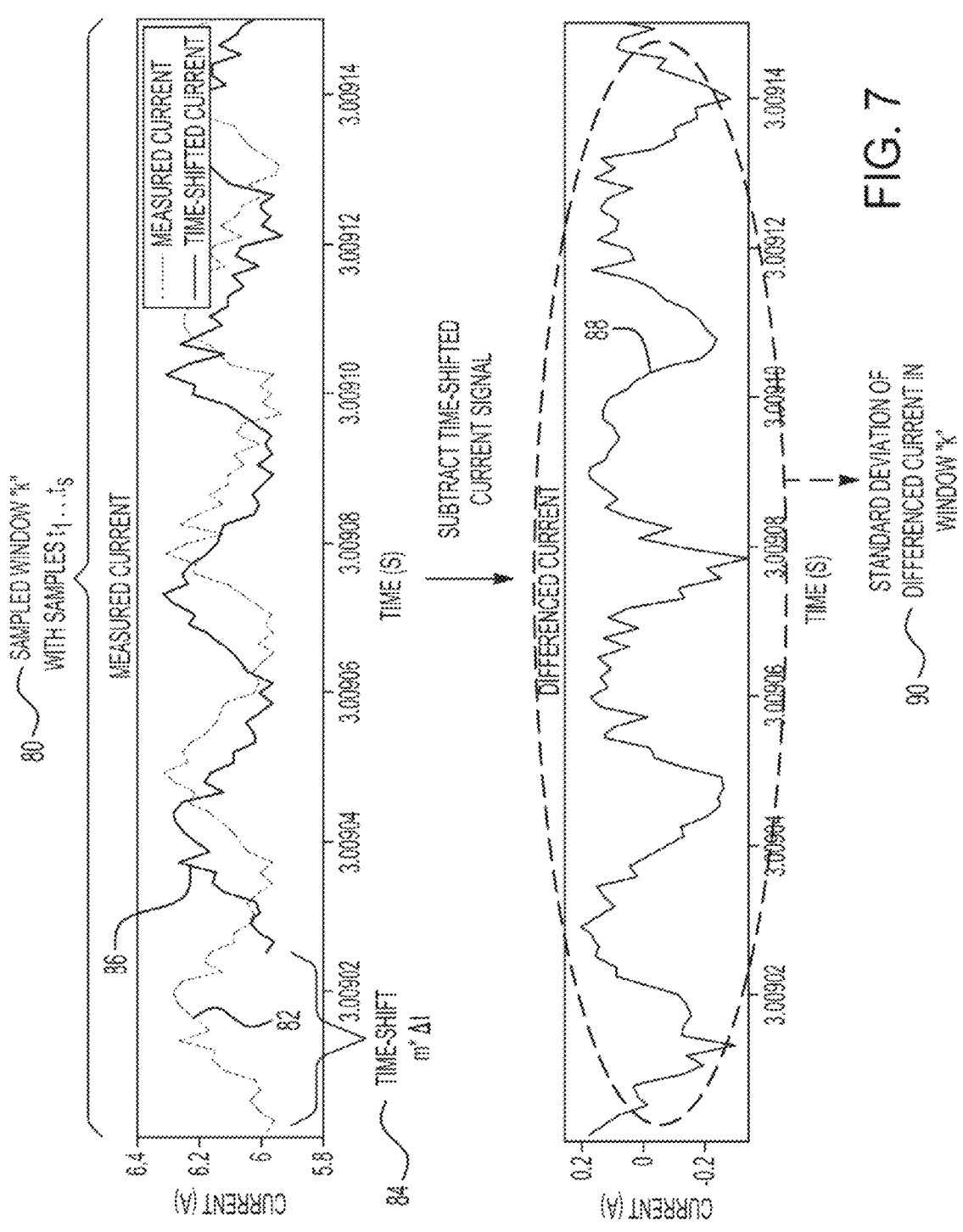
FIG. 7 graphically illustrates the steps of the method of FIG. 6.

Referring briefly to FIG. 7, and similar to FIGS. 3A-4B, various steps/features referenced in the method of FIG. 6 are graphically shown. For example, the sampled window "k" 80 is formed from a plurality of individual current measurements sampled over a period of time, the plurality of measurements forming current signal 82. The current measurements are time-shifted 84 to produce time-shifted current signal 86, which temporally lags the measured current signal 82. The time-shifted current signal 86 then is subtracted from the measured current signal 82 to produce the differenced current signal 88, and the standard deviation 90 of the differenced current signal 88 in the window k then is obtained. If this standard deviation meets predetermined criteria, then the differenced current signal 88 is used as the demodulated current.

Autocorrelation

Figure 8:
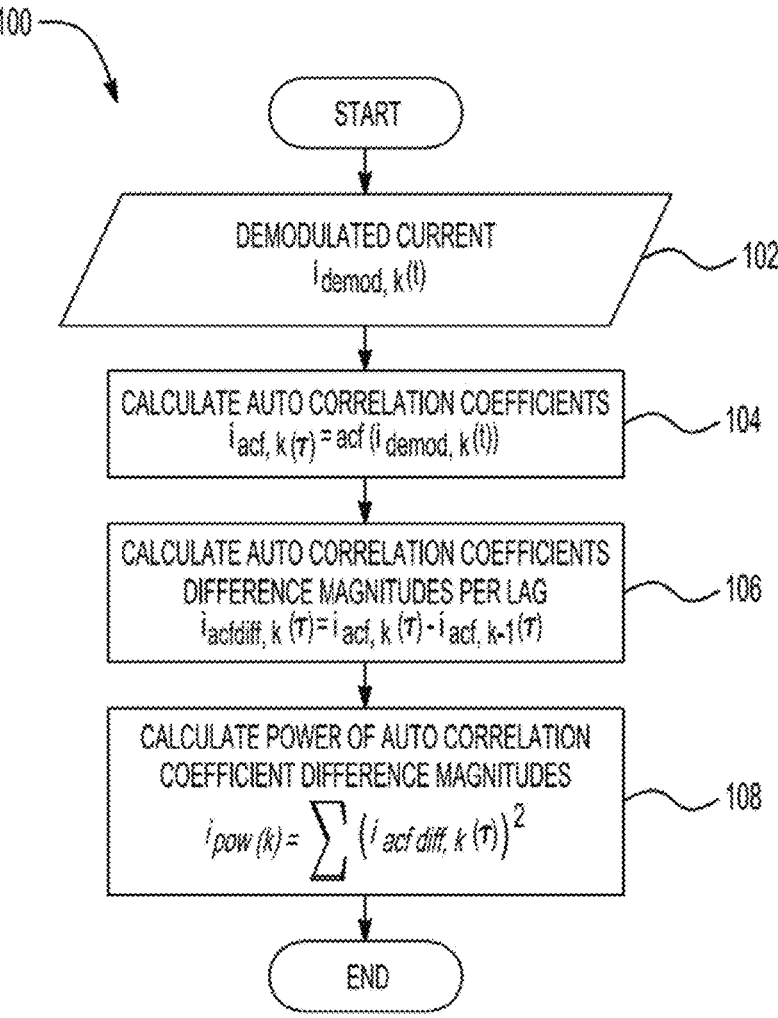
FIG. 8 is a flow chart illustrating exemplary steps of a method for calculating the power of the autocorrelation coefficient difference magnitudes in accordance with the invention.

Referring to FIG. 8, provided is a flow chart illustrating an exemplary method 100 for determining the differenced autocorrelation coefficients power signals in accordance with the invention. Beginning at step 102, the demodulated current for a specific time period $i_{demod,k}$(t) is obtained based on the method 60 in FIG. 6, and at step 104 the autocorrelation coefficients $i_{acf,k}$($\tau$) are calculated based on Eq. 10, $$i_{acf,k}(\tau)=acf(i_{demod},k(t) \qquad \text{Eq. 10}$$

where acf refers to an autocorrelation mathematical process as is known in the art, k is the index of measured current signal window, t is the sample index within the measured current window k, and $\tau$ is the autocorrelation lag. Next at step 106 autocorrelation coefficient difference magnitudes per lag $i_{acfdiff,k}$($\tau$) are calculated by subtracting the previously-obtained autocorrelation coefficient from the currently-obtained autocorrelation coefficient as shown in Eq. 11.

$$i_{acfdiff,k}(\tau)=i_{acf,k}(\tau)-i_{acf,k-1}(\tau)) \qquad \text{Eq. 11}$$

Finally, at step 108 the power of the autocorrelation coefficient difference magnitudes $i_{pow}$(k) is calculated by summing the square of each autocorrelation coefficient difference magnitude obtained in step 106 for each window k as shown in Eq. 12.

$$i_{pow}(k)=\Sigma(i_{acfdiff,k}(\tau))^2 \qquad \text{Eq. 12}$$

Figures 9A, 9B, 9C, 9D:
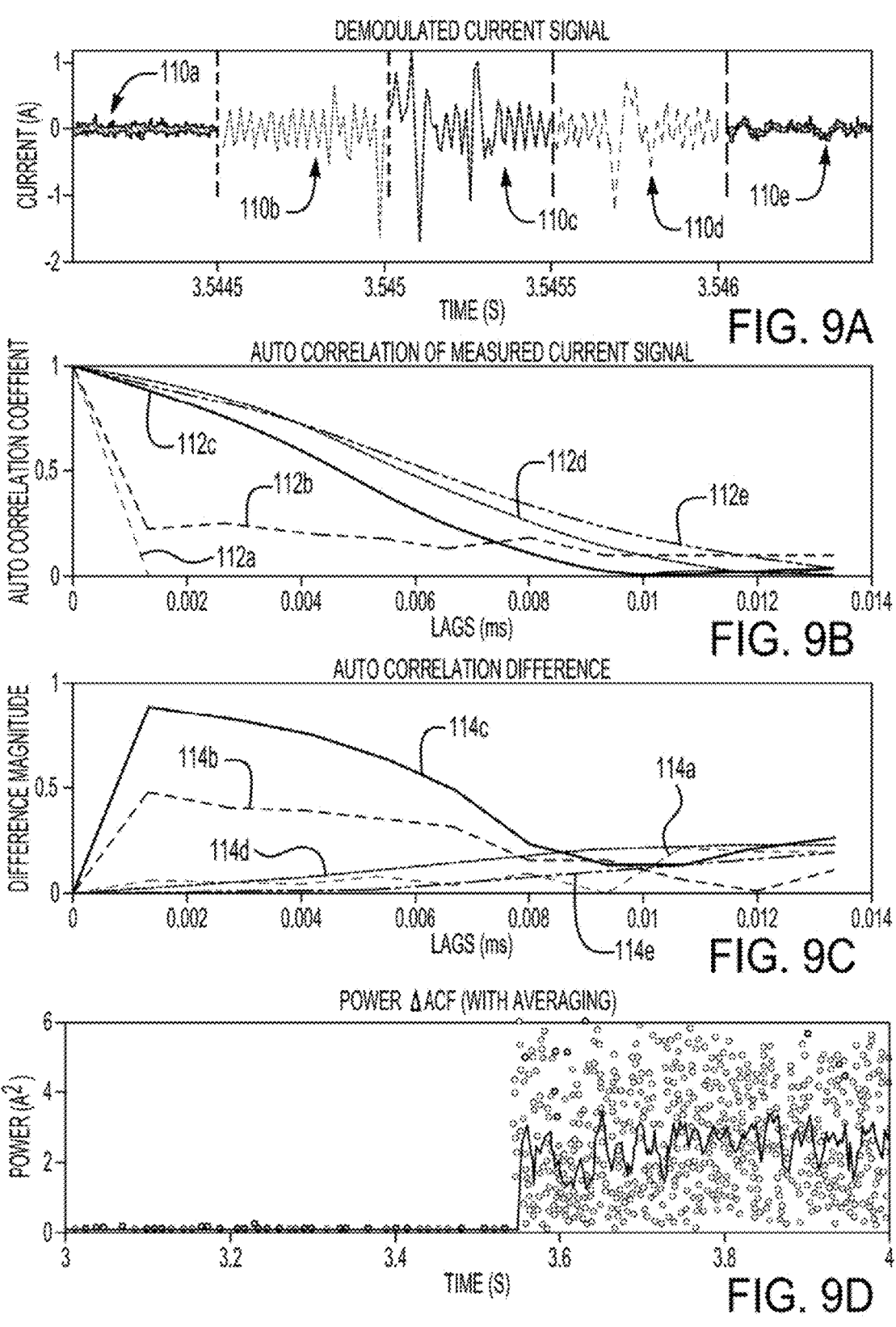
FIGS. 9A-9D are graphs showing the demodulated current signal, the autocorrelation of the measured current signal, the autocorrelation difference and the power of the differenced autocorrelation coefficients, respectively.

FIGS. 9A-9D illustrate waveforms obtained/utilized by the method 100. More particularly, FIG. 9A, which has time as the X-axis, illustrates the demodulated current signal obtained for each window k which, in FIG. 9A, includes 5 steps 110a, 110b, 110c, 110d and 110e (k=1 to 5), the demodulated current obtained using the method 60 of FIG. 6 (FIG. 8; step 102). In FIG. 9A, waveform 112a is prior to the arc fault, while waveforms 110a-110e are during an arc fault. FIGS. 9B and 9C, which have lag $\tau$ as the X-axis, illustrate the autocorrelation waveforms 112a-112e of the demodulated current waveforms (FIG. 8; step 104) and the autocorrelation difference waveforms 114a-114e (FIG. 8; step 106), respectively. In FIG. 9B, prior to an arc fault the autocorrelation coefficient, as seen in waveform 112a, is approximately 0, which indicates the signal is completely correlated to itself and there is no long-term memory in the current signal, i.e., no pink noise is detected. After an arc fault, the autocorrelation coefficients are greater than 0.5 and slowly taper with increasing lag as seen in waveforms 112b, 112c, 112d and 112e. Waveform 112b shows an arc fault after ignition of the arc (the arc fault stabilized and sustained) and, therefore, the waveform is not completely zero as in the waveform 112a, and still has some correlation (indicating nonzero coefficient values) as expected from an arc fault case. Waveforms 112c and 112d are at the ignition of the arc fault, and waveform 112e shows the duration the arc fault is stabilizing. The relatively high (>0.5) autocorrelation coefficient and subsequent taper indicates long-term memory in the current signal, i.e., pink noise is detected. FIG. 9C illustrates that as the magnitude of the difference values for the autocorrelation coefficients increase above a threshold value over a relatively short time period, then there is changing circuit conditions, i.e., an arc fault. FIG. 9D illustrates the power of the differenced autocorrelation coefficients with respect to time. To obtain the curve in FIG. 9D, the differenced autocorrelation coefficients are summed to provide the power of the autocorrelation difference magnitudes, which shows how much power is in the current signal autocorrelation coefficients. Prior to the arc fault (prior to about 3.54 seconds in FIG. 9D), the power is 0, while after the arc fault (after 3.54 seconds in FIG. 9D) the power jumps.

With continued reference to FIGS. 9B, 9C and 9D, FIG. 9C shows a sudden change occurred from the "no arcing" condition to the "potentially" arcing condition. For example, from waveform 112a to waveform 112c there is a sudden jump in autocorrelation coefficients and therefore, the difference between those two waveforms being shown in waveform 114c, which shows non-zero differenced magnitudes. As the arc continues to burn in air, it is a dynamic impedance on the system. Therefore, the difference magnitudes will continue to be non-zero since the system changes (although the changes are not as obvious when looking at only a couple of windows). From the waveforms 114d or 114e, it is not as obvious that a significant change has occurred. However, when the summation of all magnitudes for each lag is calculated, a single power point is obtained and can be seen in FIG. 9D. Waveform 114c would produce a large single power point due to the magnitudes at each lag, and it can be expected to have a value of about 6 $i_n$ FIG. 9D. In contrast, the power point of waveform 114d might produce a value of about 1 in FIG. 9D.

Outliers and Arc Fault Thresholds

In calculating the power of the autocorrelation coefficient difference magnitudes, outliers may exist that can skew the detection of arc faults, resulting in false positives. Such outliers can be eliminated to prevent such false positives. The Hampel Identifier is a means by which the outliers can be eliminated/ignored). As will be appreciated, other means of outlier elimination may be utilized without departing from the scope of the invention.

The Hampel Identifier: $x_0 = \tilde{x}$, $\zeta = S$, where $\tilde{x}$ is the sample median, $\alpha$ is usually chosen as 3, and S is defined in Eq. 13, breaks down at the contamination level greater than 50%, where the contamination level is defined by Eq. 14

$$S = \frac{1}{0.6745}\text{median}\{|x_i - \tilde{x}|\} \qquad \text{Eq. 13}$$

$$\text{contamination level} = \frac{\text{the number of outliers}}{\text{total number of samples}} \qquad \text{Eq. 14}$$

$$x_j > x_0 - \alpha\zeta$$

Figure 10A:
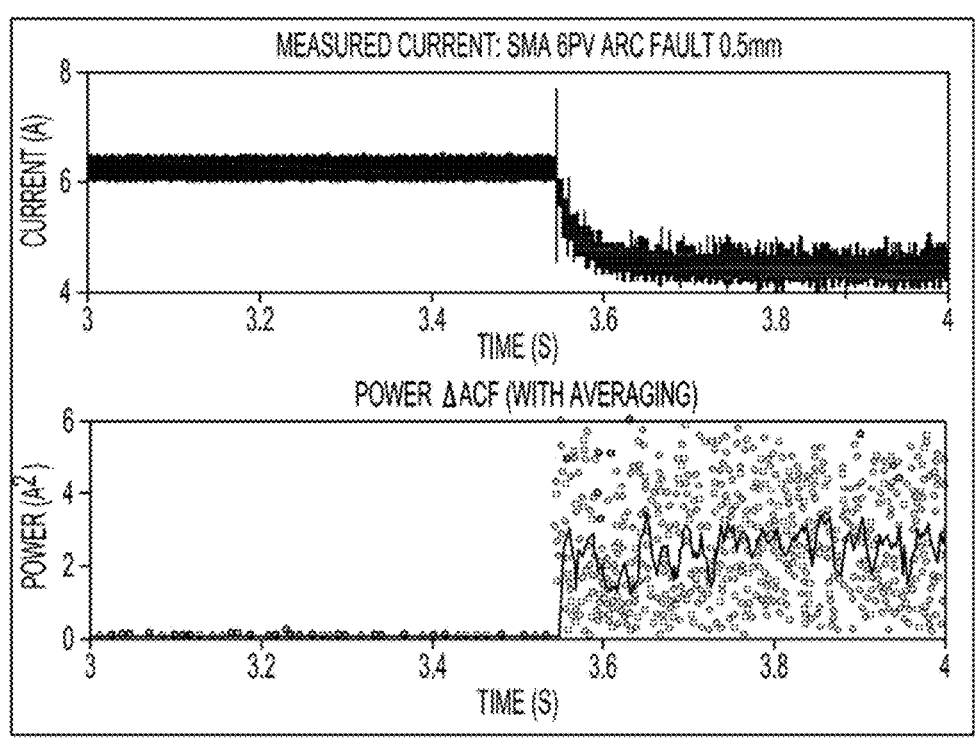
FIG. 10A illustrates the measured current during an arc fault along with the power of the differenced autocorrelation coefficients.
Figure 10B:
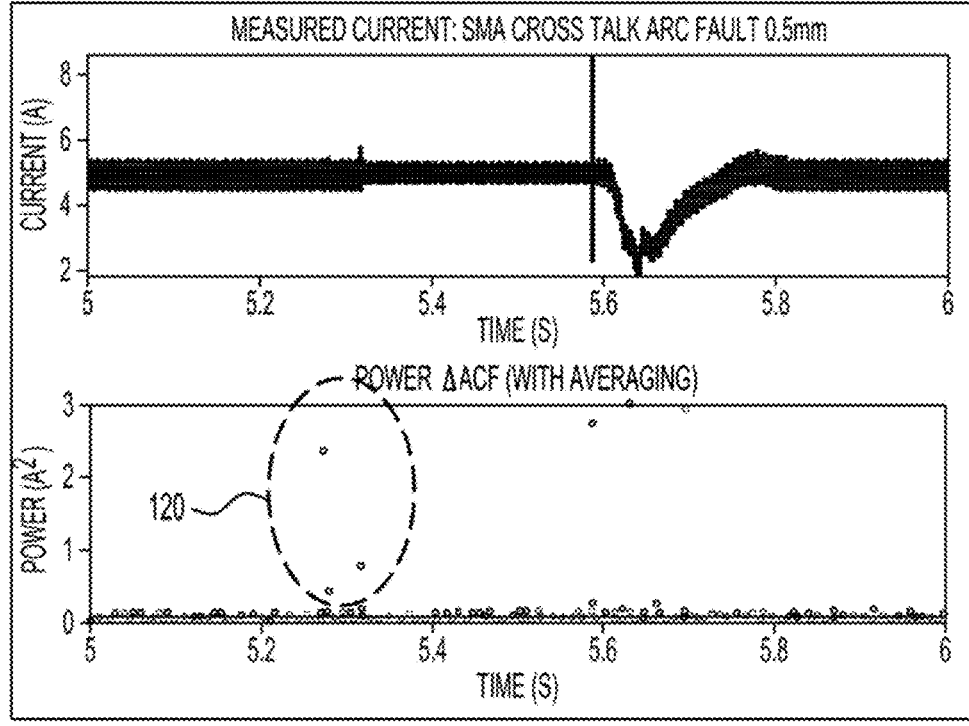
FIG. 10B illustrates the measured current with cross-talk from another PV array along with the power of the differenced autocorrelation coefficients.

With reference to FIGS. 10A and 10B, illustrated are the measured current for a PV array along with the power of the autocorrelation difference magnitudes during two different arc faults. FIG. 10A shows the measured current for a PV array undergoing an arc fault at about 3.55 seconds, while FIG. 10B shows the measured current for a PV array not undergoing an arc fault but having skewed data (outliers 120) due to an arc fault on a different PV array. In the arc fault case of FIG. 10A, the variation and average value of the power signal of the autocorrelation coefficients increases. Because the entire statistical set changes, the contamination value can be seen to increase from almost 0% to almost 100% and, thus, the Hampel Identifier is intentionally broken. In the unwanted tripping case of FIG. 10B, abrupt changes in the current signal momentarily change the average and variation of the power signal. However, because it is momentary, the outliers 120 can be detected and ignored.

Figure 11:
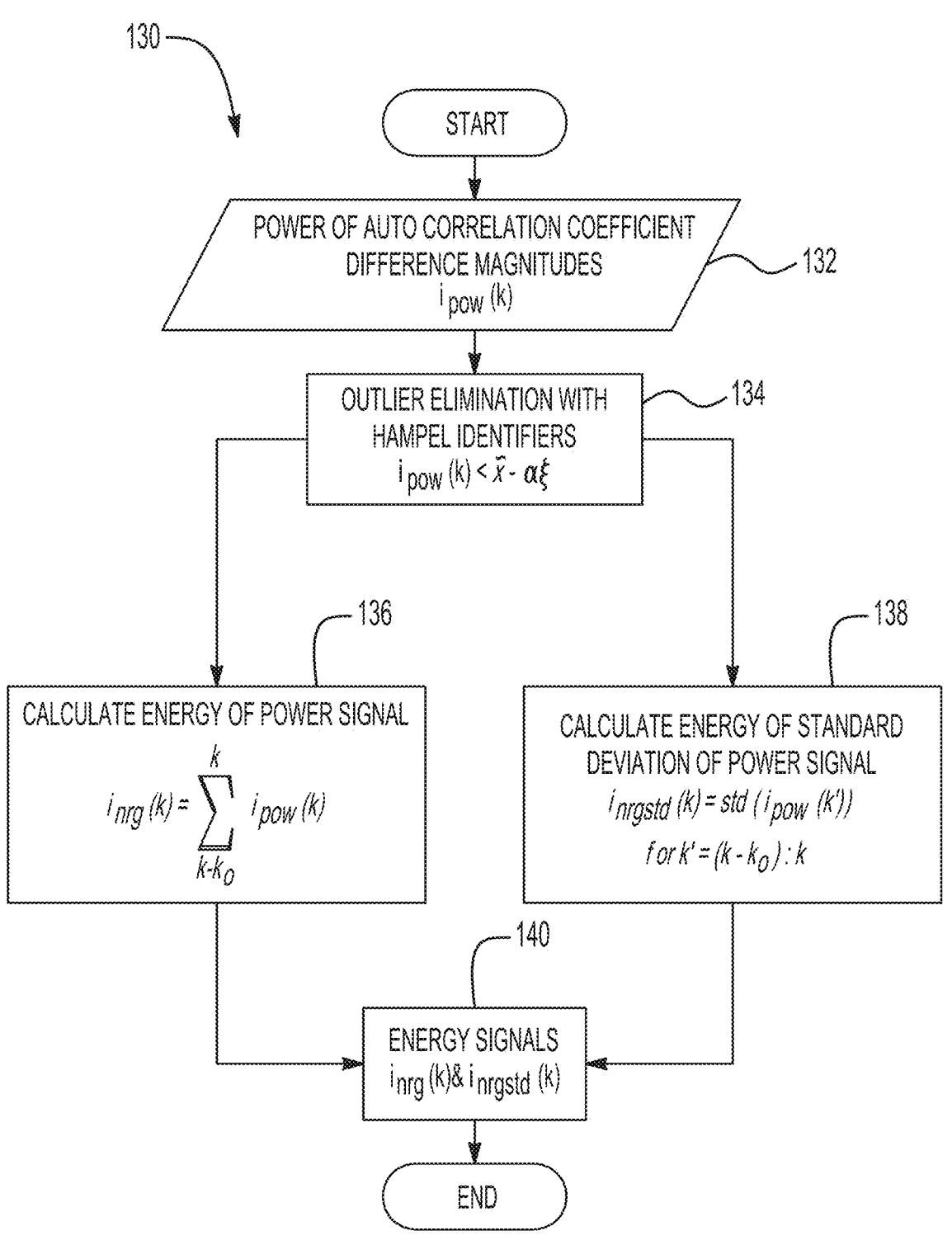
FIG. 11 is a flow chart illustrating exemplary steps of a method for obtaining energy signals used to eliminate the effect of outliers in accordance with the invention.

With reference to FIG. 11, illustrated is a method 130 for ignoring outliers 120 when determining the autocorrelation coefficients. Beginning at step 132, the power of the autocorrelation coefficient difference magnitudes $i_{pow}(k)$ as determined from the method 100 of FIG. 8 is obtained, and at step 134 outliers are eliminated using Hampel Identifiers as shown in Eq. 15, $$ipow(k) < \tilde{x} - \alpha\zeta \qquad \text{Eq. 15}$$

where k refers to an index of the sampled window having samples $t_1$-$t_s$, $\tilde{x}$ is the sample median, a is chosen as 3, and $\zeta$ is set to S as defined in EQ. 13 above.

The method then splits into two parallel paths, where at step 136 the energy of the power signal $i_{nrg}(k)$ is calculated as shown in Eq. 16, $$inrg(k) = \sum_{k-k0}^{k} ipow(k) \qquad \text{Eq. 16}$$

12 where k refers to an index of the sampled window having samples $t_1$-$t_s$, and $k_0$ refers to the first window in the energy calculation. Further, at step 138 the energy of the standard deviation of the power signal $i_{nrgstd}(k)$ is calculated as shown in Eq. 17, $$inrgstd(k) = std((ipow(k')) \text{ for } k' = (k-k0):k \qquad \text{Eq. 17}$$

Upon calculating both the energy of the power signal $i_{nrg}(k)$ and the energy of the standard deviation of the power signal $i_{nrgstd}(k)$, the method moves to step 140 and the energy signals are stored for use in the threshold detection method of FIG. 12, as discussed below.

Figure 12:
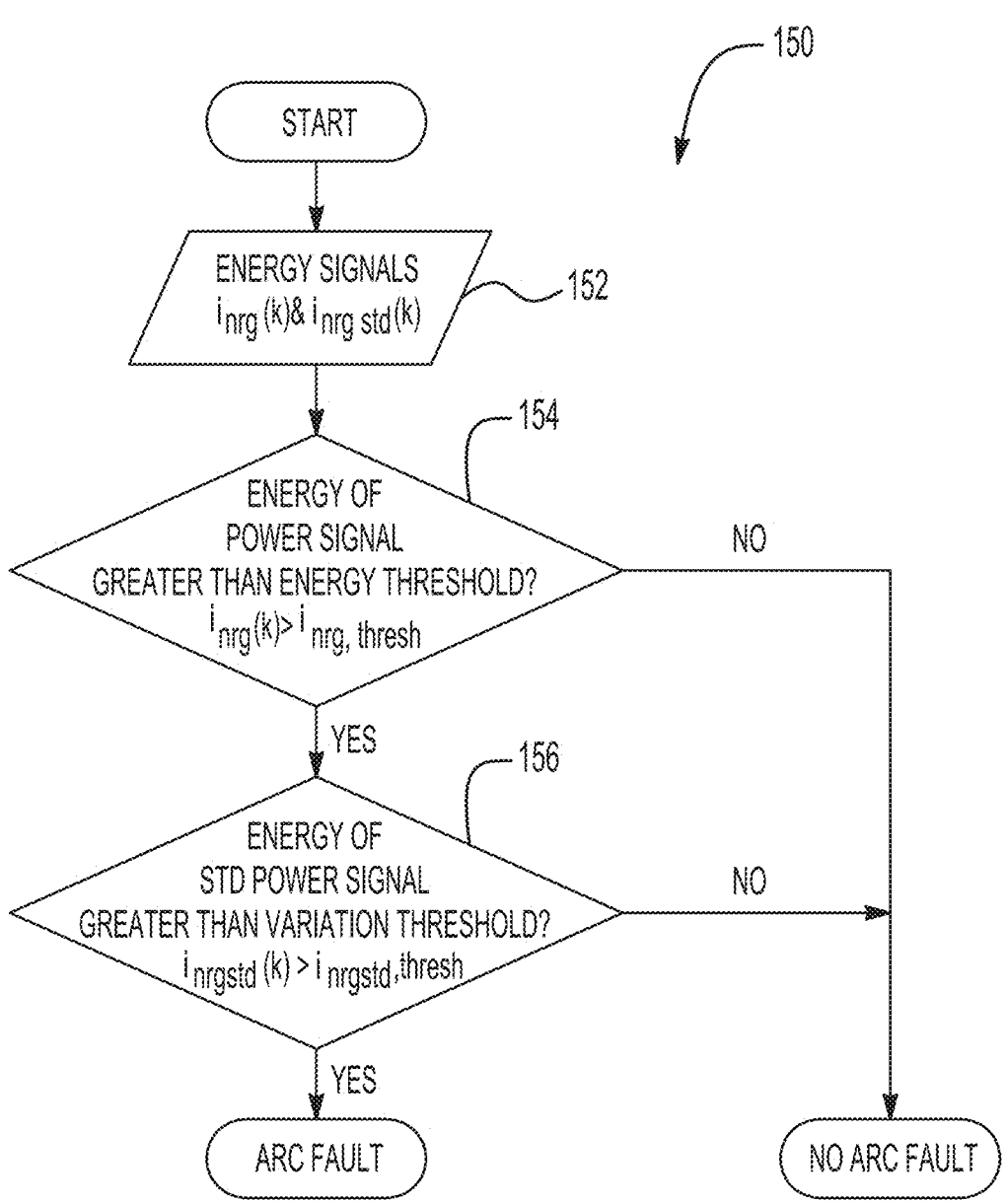
FIG. 12 is a flow chart illustrating exemplary steps of a method for detecting when an arc fault has occurred in accordance with the invention.

Referring now to FIG. 12, illustrated is a method 150 for generating thresholds that are subsequently used to determine if an arc fault has occurred. Beginning at step 152, the energy signals $i_{nrg}(k)$ and $i_{nrgstd}(k)$ for the window k obtained by the method 130 of FIG. 11 are retrieved. At step 154, the energy of the power signal $i_{nrg}(k)$ is compared to a threshold value, and if the energy of the power signal is not greater than the threshold it is concluded an arc fault has not occurred. However, if the energy of the power signal $i_{nrg}(k)$ is greater than the threshold, the method moves to step 156 where the energy of the standard deviation of the power signal $i_{nrgstd}(k)$ is compared to a threshold value, and if the energy of the standard deviation of the power signal is not greater than the threshold it is concluded that an arc fault has not occurred. However, if the energy of the standard deviation of the power signal is greater than the threshold, it is concluded that an arc fault has occurred.

Figures 13A, 13B, 13C, 13D:
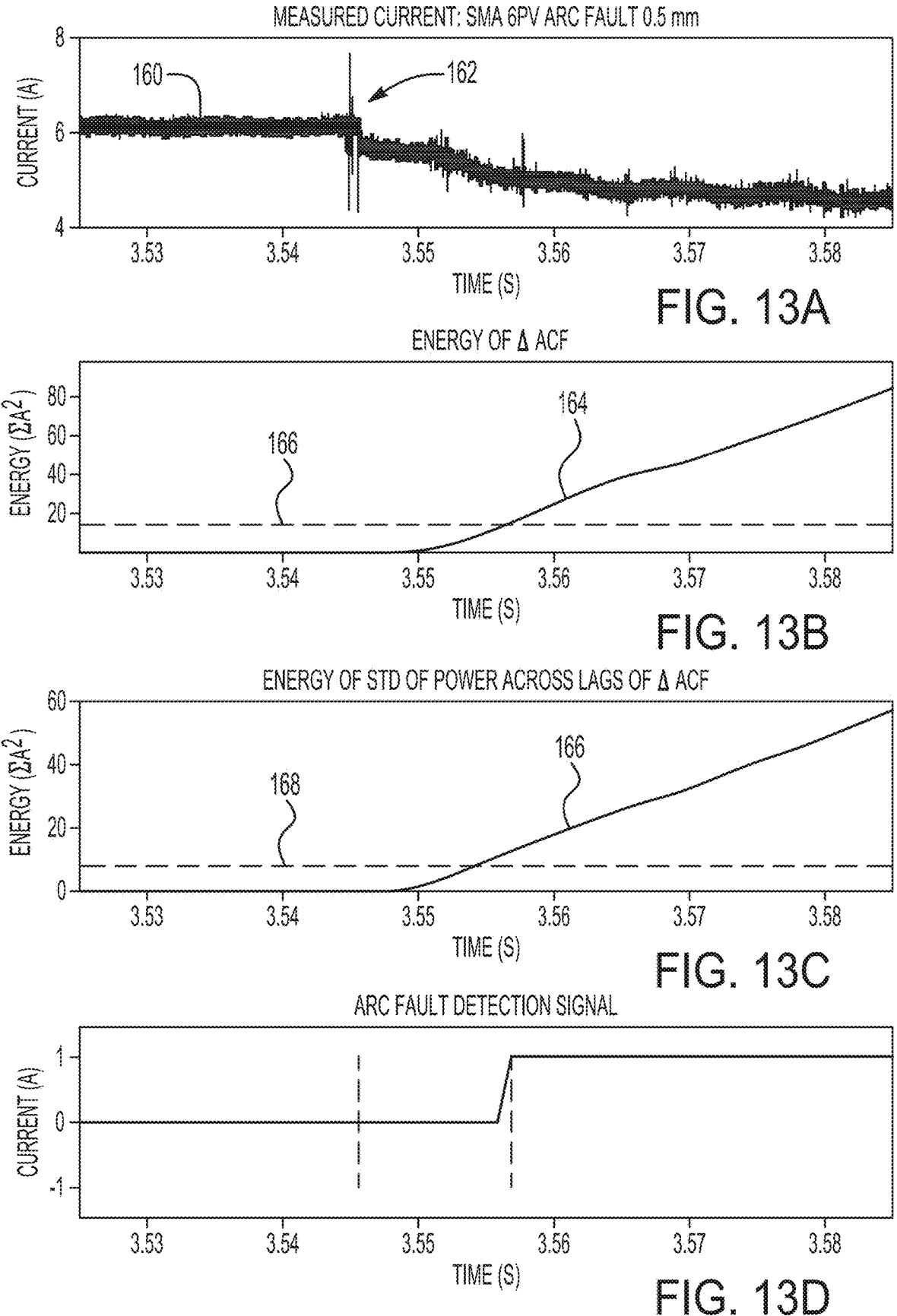
FIGS. 13A-13D are graphs showing application of the inventive method to a PV array, and include the measured PV array current, the energy of the differenced autocorrelation coefficients of the measured PV array current, the energy of the standard deviation of power across lags of the differenced autocorrelation coefficients, and the detection of an arc fault, respectively.

Accordingly, both the energy of the power signal and the energy of the standard deviation of the power signal must exceed respective thresholds for it to be concluded an arc fault has occurred. This is illustrated graphically in FIGS. 13A-13D. More particularly, FIG. 13A illustrates a current waveform 160 with an arc fault 162 occurring at approximately 3.545 seconds. Prior to the arc fault, the current is relatively steady. When the arc fault occurs, a current spike is seen and then the current tapers downward. FIG. 13B illustrates the energy of the differenced autocorrelation coefficients 164, which prior to the arc fault remain at 0. Shortly after the arc fault, the energy of the differenced autocorrelation coefficients begins to rise, eventually exceeding the threshold value 166 (at about 3.557 seconds). Thus, the energy of differenced autocorrelation coefficients ($\Delta$ACF) indicates the presence of added long-term memory to the current signal, which is indicative of pink noise. FIG. 13C illustrates the energy of the standard deviation of power across lags of the differenced autocorrelation coefficients 166, which prior to the arc fault remain at 0. When the arc fault occurs, the curve 166 begins to rise, eventually exceeding the threshold value 168 (at about 3.553 seconds). Thus, the energy of standard deviation of $\Delta$ACF indicates inconsistency of circuit parameters, which is indicative of changing arc fault impedance. When both curves 164 and 168 have exceed their respective threshold values, an arc fault flag is trigged as illustrated in FIG. 13D.

Without outlier elimination the power and energy signal show false alarm peaks with sudden momentary transients in the current signal. With outlier elimination the power and energy signals do not generate significant peaks.

Example Applications

Figure 14A:
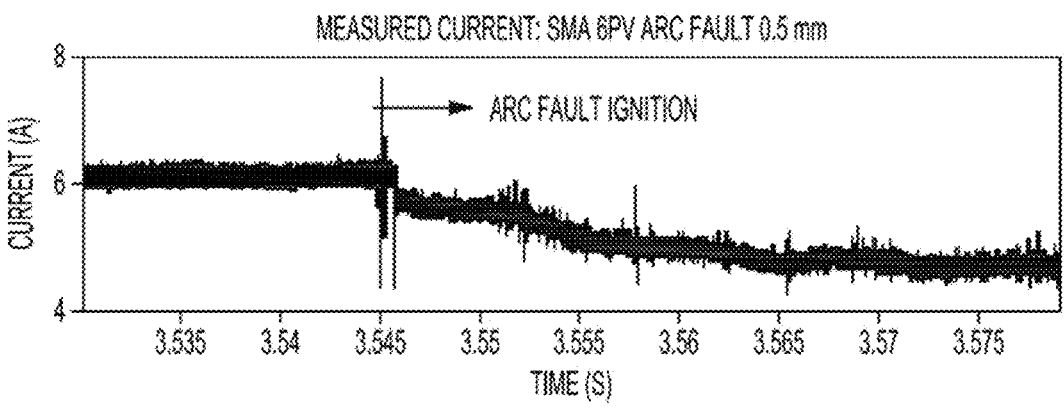
FIGS. 14A-14C are graphs showing application of the inventive method to the PV array, and include the measured current for the PV array with an arc fault, the shift coefficients for each window, and the demodulated current, respectively.
Figure 14B:
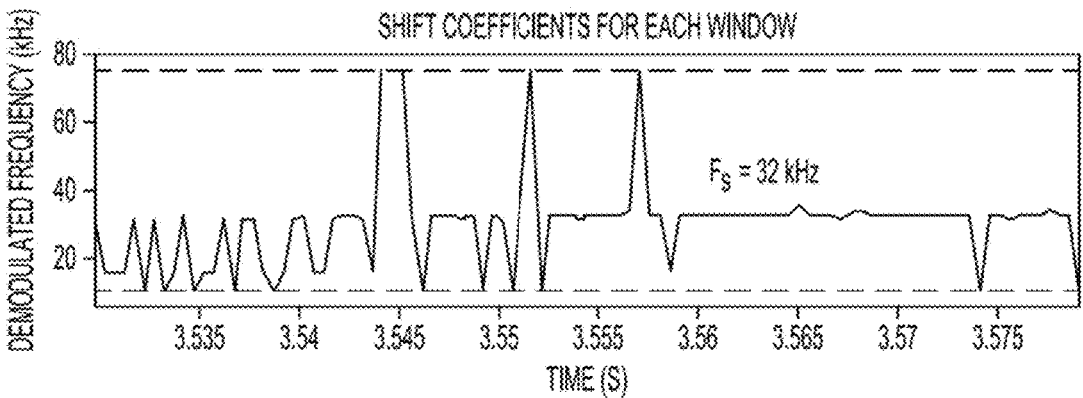
Figure 14C:
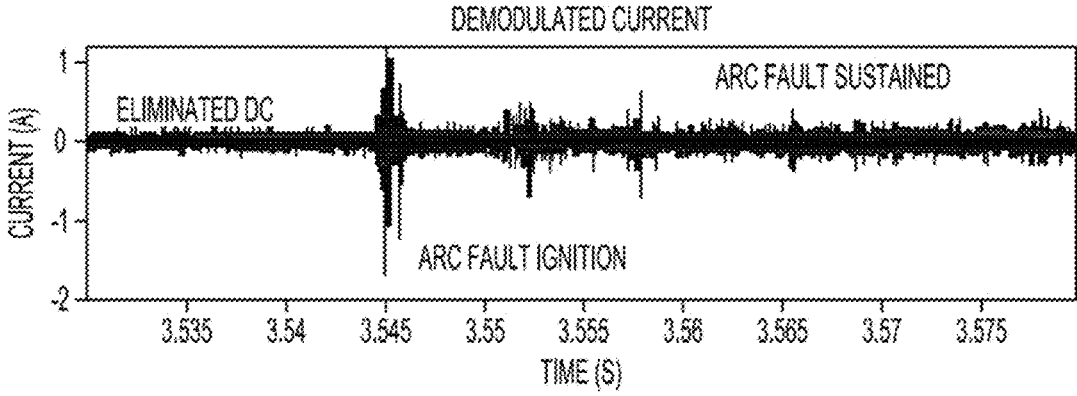
Figures 15A, 15B, 15C, 15D:
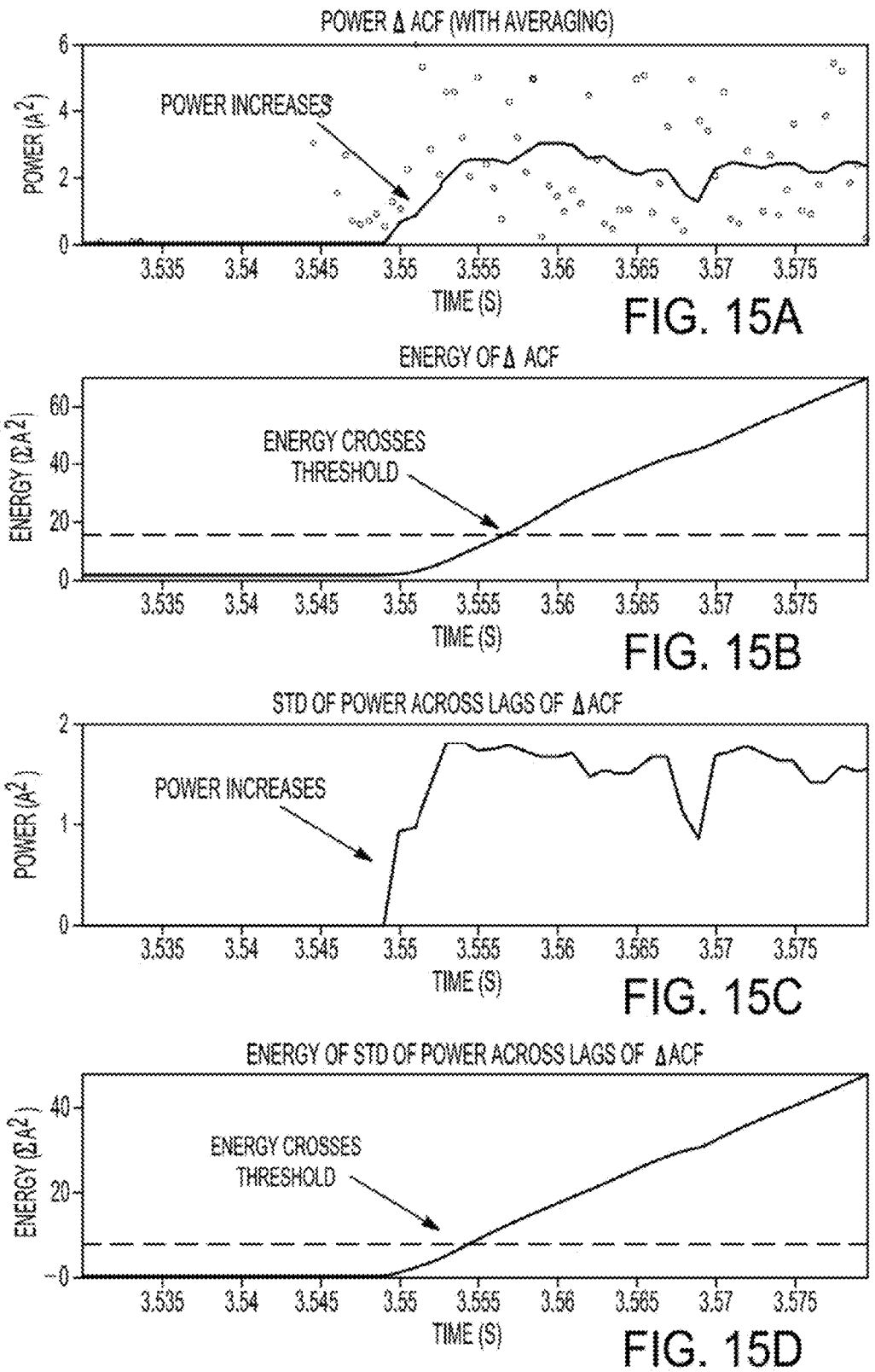
FIGS. 15A-15D are graphs showing application of the inventive method to the PV array, and include the power of the differenced autocorrelation coefficients, the energy of the differenced autocorrelation coefficients, the standard deviation of the power of the differenced autocorrelation coefficients, and the energy of the standard deviation of power across lags of the differenced autocorrelation coefficients, respectively.
Figure 16A:
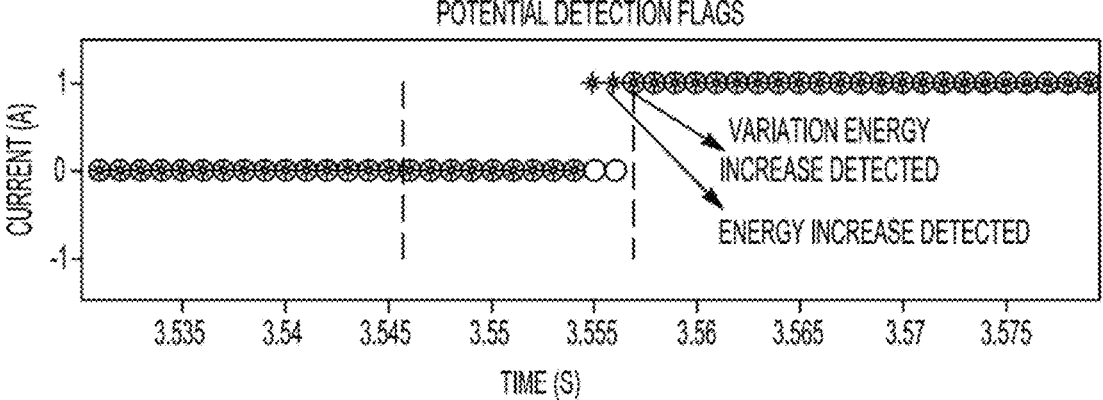
FIGS. 16A and 16B illustrate potential detection flags in the current signal and generation of an arc fault flag, respectively, for the PV array application.
Figure 16B:
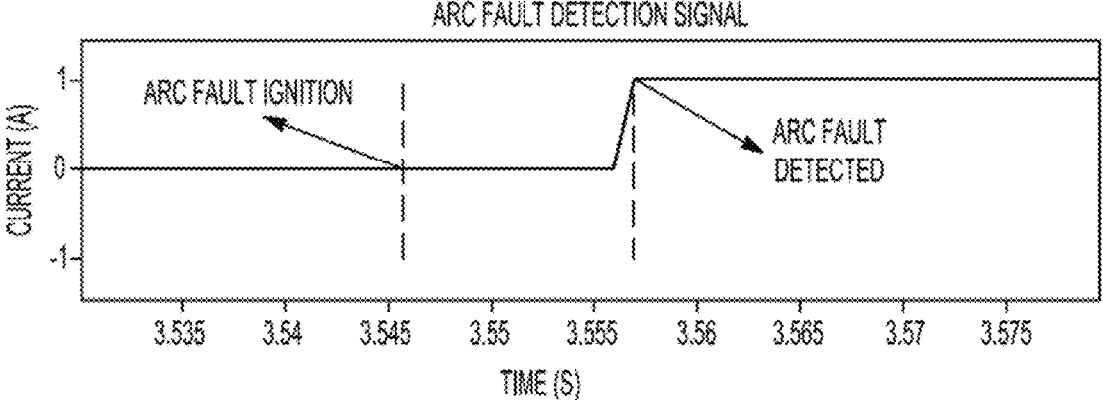

FIGS. 14-23 illustrate application of the method according to the invention to various types of arc faults. FIGS. 14-16 pertain to a series PV array arc fault with an inverter manufactured by SMA. In FIG. 14A, the PV array current is illustrated where an arc fault is generated at about 3.545 seconds, and in FIG. 14B (which shows the shift coefficients for each window, the shift coefficient describing the predicted switching frequency in the system as given by the time-shift of the signal; the time-shift of the current signal−1/(m*Δt)), the demodulation algorithm indicates periodic behavior around 32 kHz. In FIG. 14C the demodulated current is shown, where the DC component has been eliminated and no switching frequency is seen from the inverter. However, the signal still contains arc fault noise signatures at ignition and steady-state of the arc fault. In FIG. 15A, the power of the difference between autocorrelation coefficients increases after an arc fault indicating some long-term memory. In FIG. 15B the energy of the differenced autocorrelation coefficients steadily increase past the detection threshold, and in FIG. 15C the standard deviation of the differenced autocorrelation coefficients is low and then suddenly increases, indicating continued variation in the circuit parameters. In FIG. 15D the energy of the standard deviation of the power of the differenced autocorrelation coefficients steadily increases past the threshold value. FIG. 16A shows the potential detection flags, where during the arc fault event both an increase is detected for both a variation in energy and for energy, and FIG. 16B shows that the method concludes an arc fault has occurred.

Figure 17A:
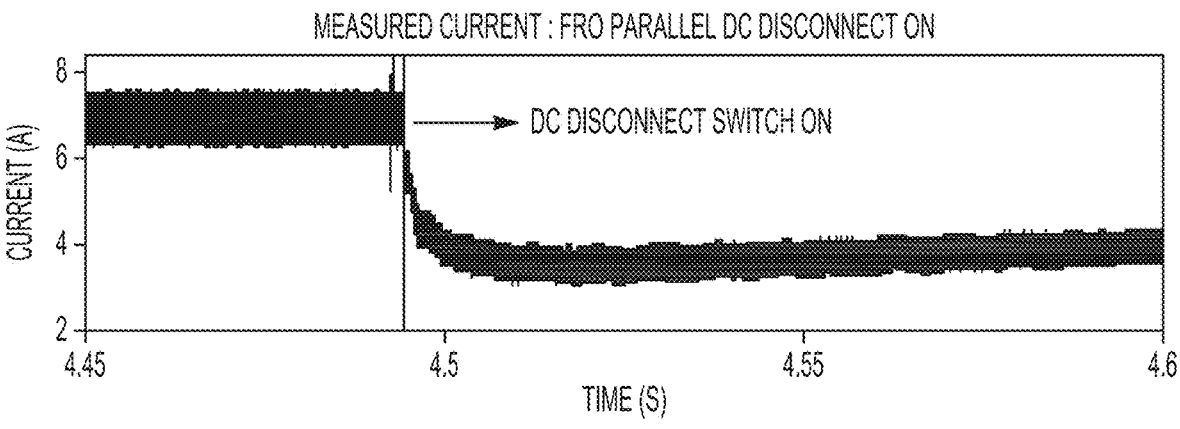
FIGS. 17A-17C are graphs showing application of the inventive method to a parallel DC disconnect being moved to the ON position, and include the measured PV array current, the shift coefficients for each window, and the demodulated PV array current, respectively.
Figure 17B:
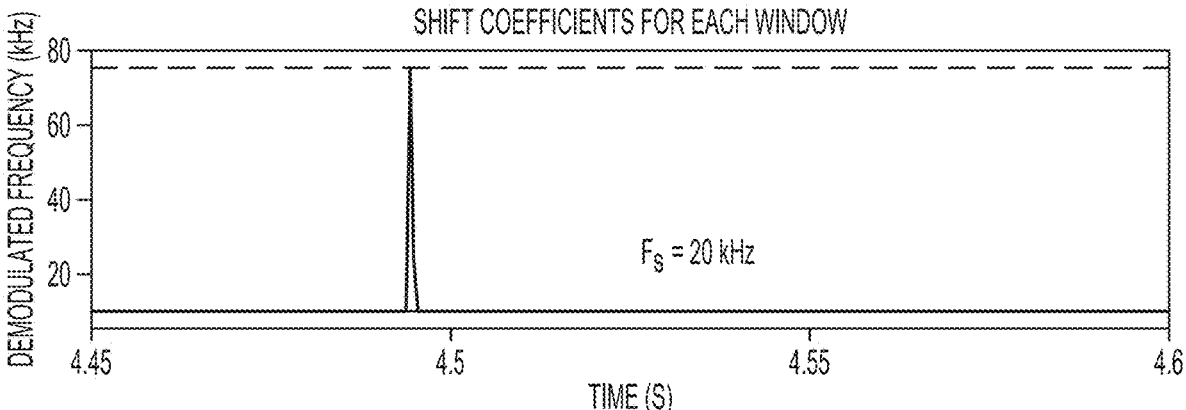
Figure 17C:
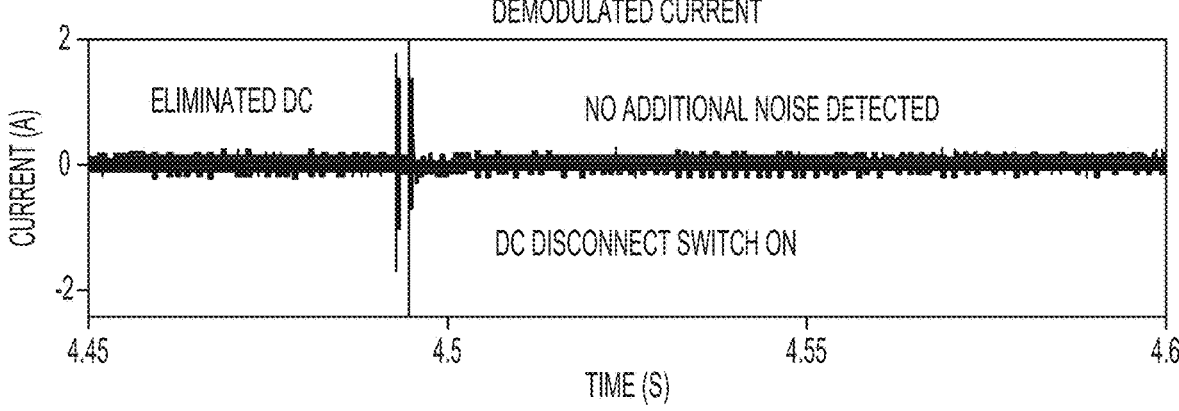
Figures 18A, 18B, 18C, 18D:
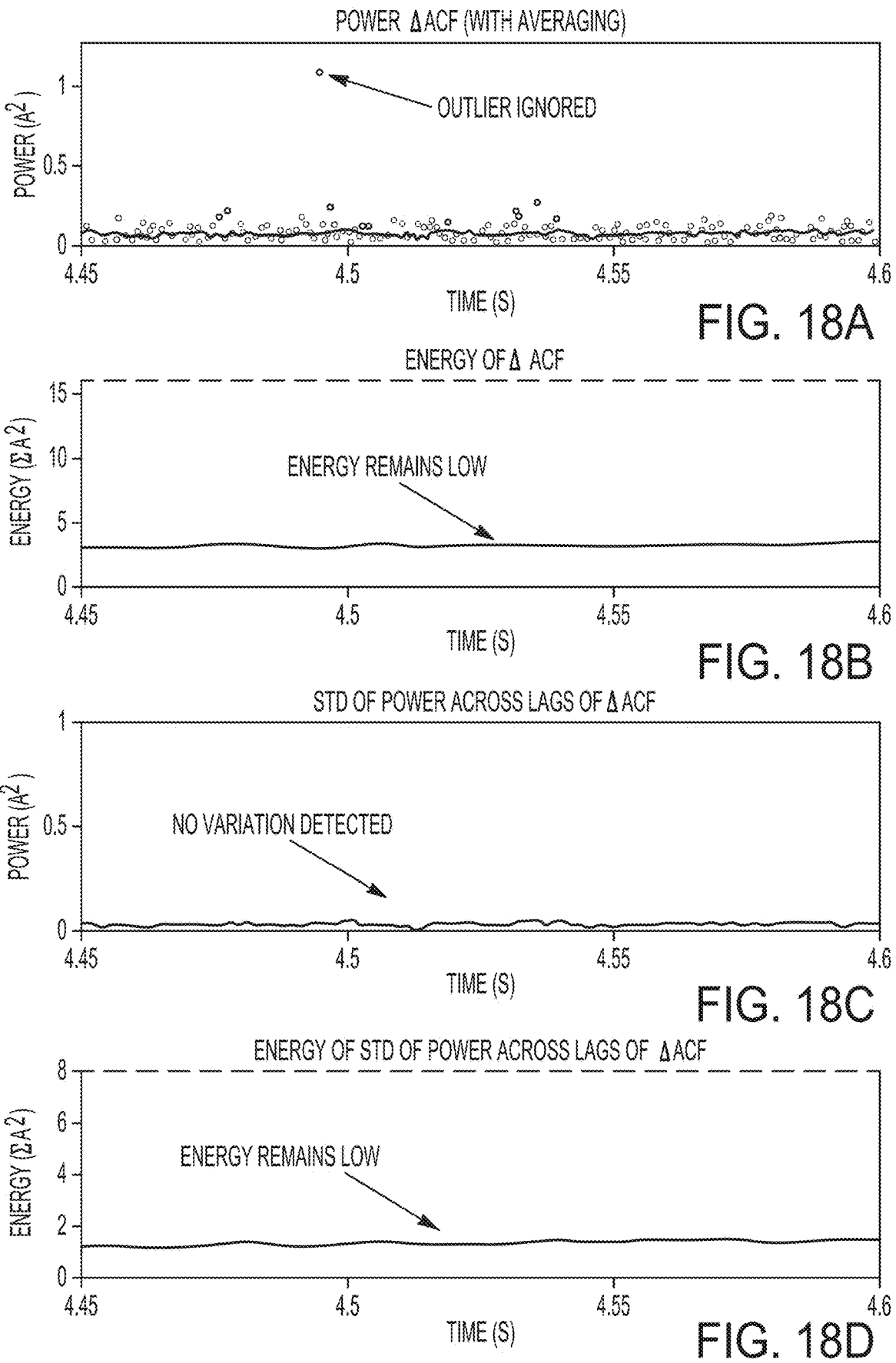
FIGS. 18A-18D are graphs showing application of the inventive method to the DC disconnect application, and include the power of the differenced autocorrelation coefficients, the energy of the differenced autocorrelation coefficients, the standard deviation of the power across lags for the differenced autocorrelation coefficients, and the energy of the standard deviation of power across lags for the differenced autocorrelation coefficients, respectively.
Figures 19A, 19B, 20A, 20B:
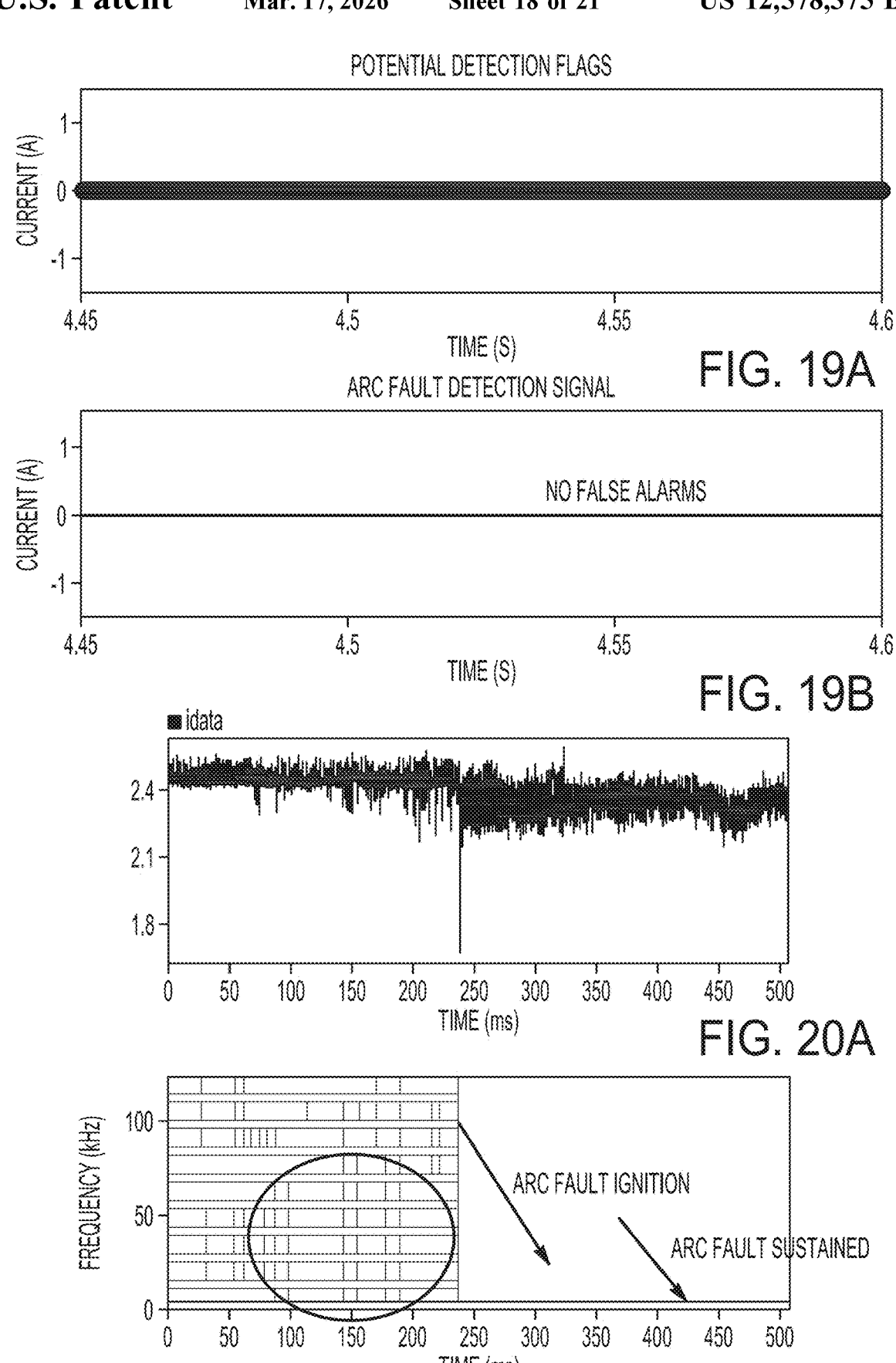
FIGS. 19A and 19B illustrate potential detection flags in the current signal and generation of an arc fault flag, respectively, for the DC disconnect application.
FIGS. 20A and 20B are graphs showing data from a PV array and inverter system that had been previously-collected (i.e., not in real time), and include measured current from the PV array and a frequency response of the measured current, respectively.

FIGS. 17-19 illustrate application of the method to a scenario in which a DC disconnect switch connected to the PC array is operated. FIG. 17A illustrates the current provided by a parallel PV array, where a disconnect switch is operated at about 4.492 seconds, thereby producing a current spike and subsequent taper of the current. In FIG. 17B (which shows shift coefficients) the demodulation algorithm indicates periodic behavior around 10 kHz (the demodulation algorithm shifted the current signal into two inverter switching periods). In the present example, the actual switching frequency of the inverter is 20 kHz. However, the demodulation algorithm determined 10 kHz to be the more optimal solution (10 kHz is a 720 degree shift of the current waveform and still eliminates the switching frequency). It is noted that the determined shift coefficient of 10 kHz does not actually mean 10 kHz has been eliminated from the signal; the 10 kHz is the result of a 720 degree TIME shift (2 times the switching frequency), and indicates the TIME and not the actual FREQUENCY. In FIG. 17C the demodulated current is shown, where the DC component is eliminated and no switching frequency is seen from the inverter. However, the demodulated current still indicates some sudden transient near 4.5 seconds due to operation of the DC disconnect switch, but no difference in noise is seen before and after the transient is detected. FIG. 18A illustrates an outlier generated from a single DC disconnect switch event, where the outlier is ignored. In FIG. 18B, the energy of the differenced autocorrelation coefficients remains constant and correctly ignores the current magnitude decrease and DC disconnect switch operation. In FIG. 18C the standard deviation of the power of the differenced autocorrelation coefficients indicates no variation and thus the additional PV array did not introduce any significant inconsistent noisy behavior. Also, in FIG. 18D the energy of the standard deviation of the differenced autocorrelation coefficients remains constant, and thus correctly observes a consistent noise state with no sudden changing impedances. FIG. 19A shows the current waveform being flat and thus there are no changes in the energy of the power signal or in the variation of the power signal, so an arc fault is not generated, as shown in FIG. 19B.

FIGS. 20-22 illustrate previously-obtained data from a potential intermittent arc fault, where the method in accordance with the invention is applied to the data at a later time (i.e., the data was exported and a simulation was performed using the arc fault detection method with the exported data). In FIG. 20A, an arc fault is generated at about 0.03 seconds, but evidence from the site suggests this arc fault was manually generated. In other words, intermittent arcs may have been generated by human error while separating electrodes. This is supported by the data of FIG. 20B, which indicates no apparent dominating switching noise contamination.

Figure 21A:
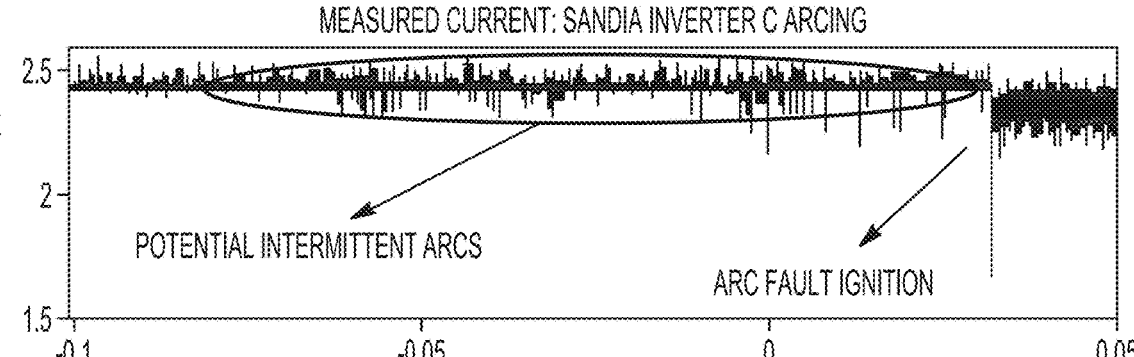
FIGS. 21A-21C are graphs showing application of the inventive method to the previously-collected data, and include the measured current, the shift coefficients for each window, and the demodulated current, respectively.
Figure 21B:
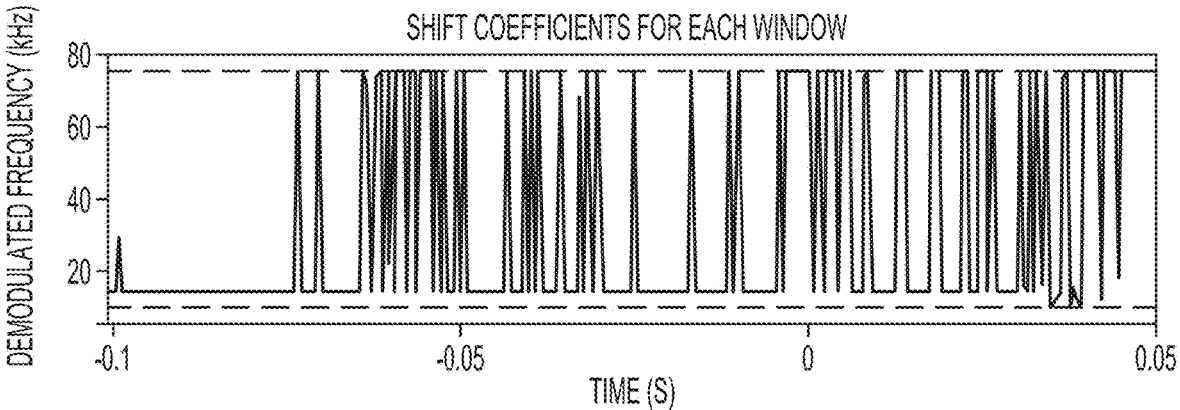
Figure 21C:
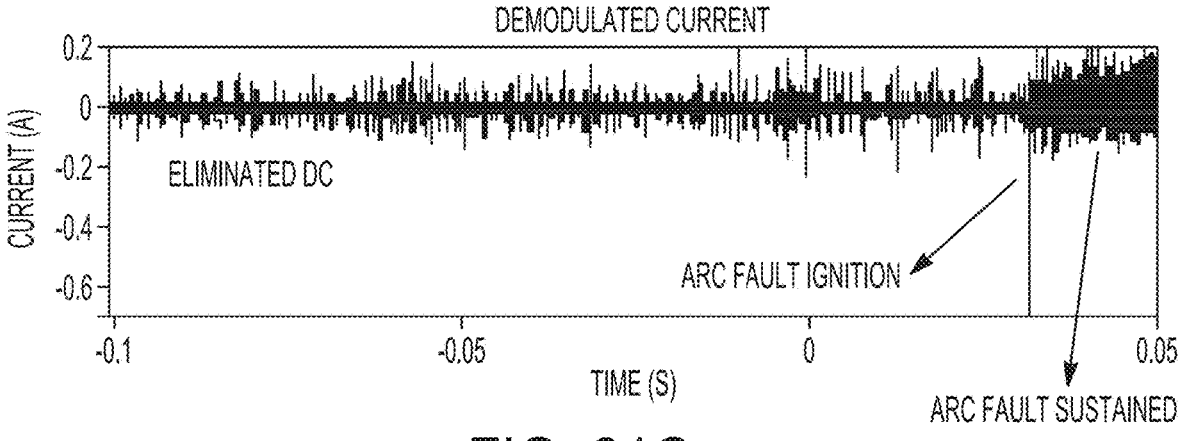
Figures 22A, 22B, 22C, 22D:
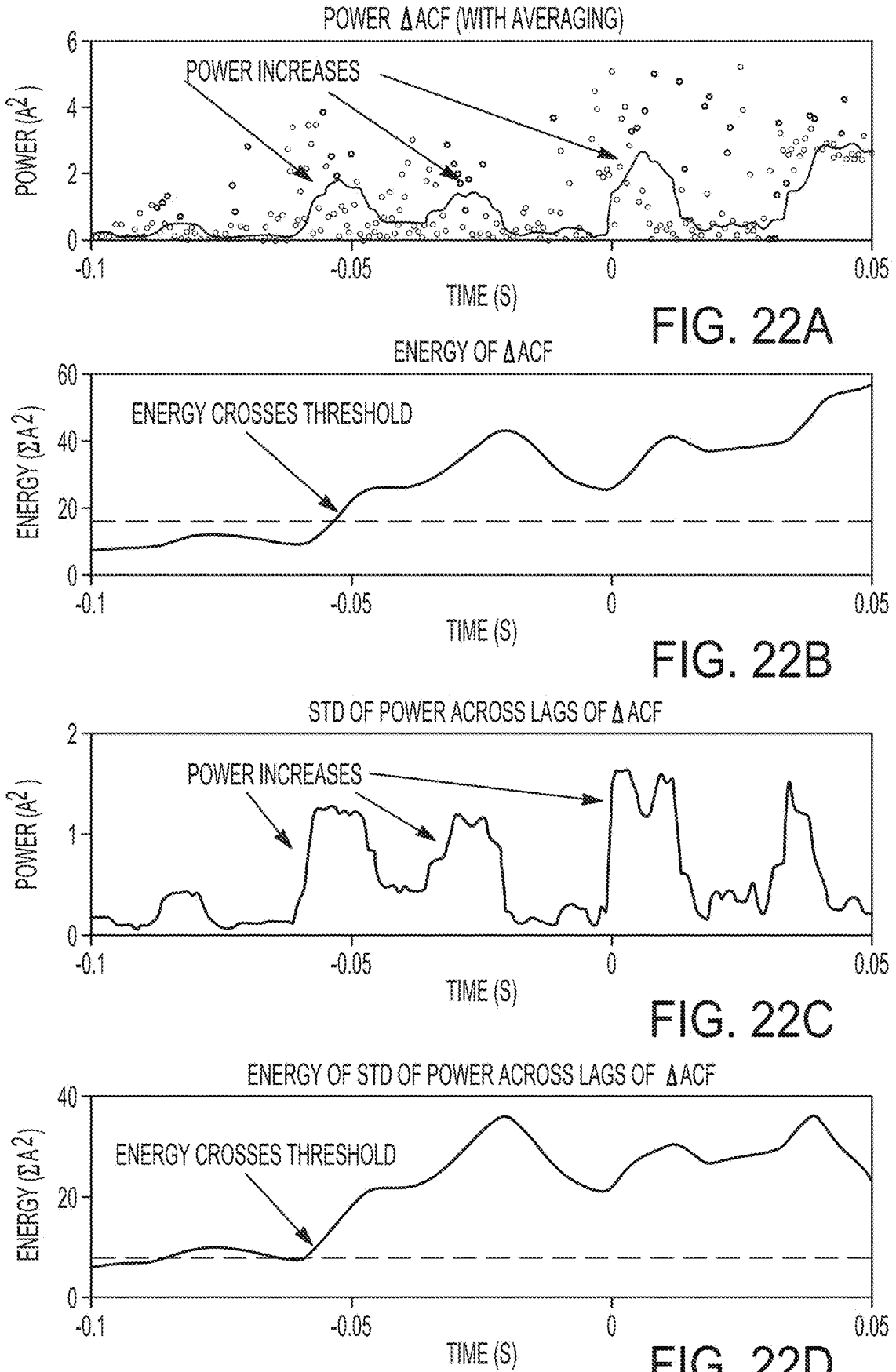
FIGS. 22A-22D are graphs showing application of the inventive method to the collected data, and include the power of the differenced autocorrelation coefficients, the energy of the differenced autocorrelation coefficients, the standard deviation of the power across lags for the differenced autocorrelation coefficients, and the energy of the standard deviation of power across lags for the differenced autocorrelation coefficients, respectively.
Figure 23A:
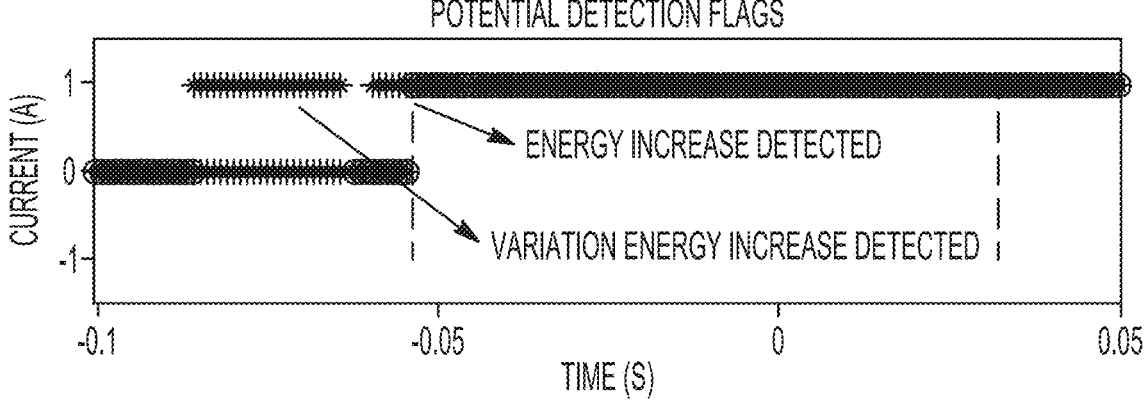
FIGS. 23A and 23B illustrate potential detection flags in the current signal and generation of an arc fault flag, respectively, for the DC disconnect application.
Figure 23B:
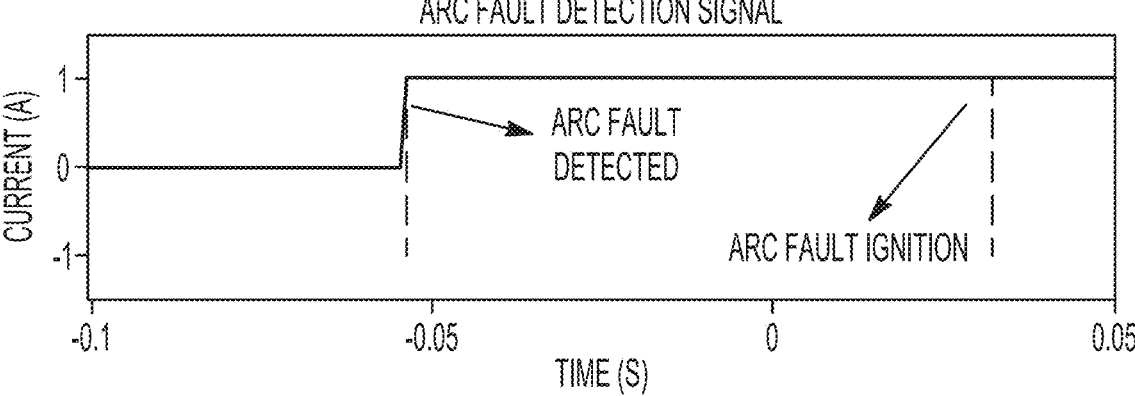

FIG. 21A is a detailed view of the current waveform provided by the PV array, illustrating potential intermittent arcs and an arc fault ignition. In FIG. 21B, shift coefficients for the demodulated frequency for each window are illustrated, while in FIG. 21C the demodulated current is shown, where the DC component has been eliminated and no switching frequency is seen from the inverter. However, arc fault noise signatures are present as evidenced by the arc fault ignition data at the far-right of FIG. 21C. In FIG. 22A, the power of the differenced autocorrelation coefficients is shown, and arc fault noise can be seen prior to the arc fault being generated. In FIG. 22B the energy of the differenced autocorrelation coefficients steadily increases past the detection threshold while the arc fault is intermittent, and in FIG. 22C the standard deviation of the power of the differenced autocorrelation coefficients increases, indicating variation in the circuit parameters. FIG. 22D shows the energy of the standard deviation of differenced autocorrelation coefficients increases past the detection threshold while the arc fault is intermittent. In FIG. 23A, the energy in the power signal and the variation in the power signal is seen to increase before the arc fault is "officially" generated, and as seen in FIG. 23B the intermittent arcs are consistent enough to keep the energy values high and cross the detection thresholds and, thus, an arc fault is flagged.

Accordingly, the potential series PV array arc fault detection algorithm can detect series PV array arc faults, detect potential intermittent arc faults, isolate and ignore switching frequency noise from the inverter, detect pink noise generated by arc faults, and detect arc fault impedance variations as it burns in air.

Modifications and alterations of the structures shown in the drawings will become apparent to those skilled in the art after reading the present specification. It is intended that all such modifications and all variations being included in so far as they come within the scope of the patent as claimed or the equivalence thereof.

Although the invention has been shown and described with respect to a certain embodiment or embodiments, equivalent alterations and modifications may occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein exemplary embodiment or embodiments of the invention. In addition, while a particular feature of the invention may have been described above with respect to only one or more of several embodiments, such feature may be combined with one or more other features of the other embodiments, as may be desired and advantageous for any given or particular application.

What is claimed is:

1. A method for detecting arc faults in a direct current (DC) power system comprising a DC power source, a load, and a circuit protection device, wherein a current sensor is electrically connected to the DC power system and operative to measure a current supplied to the load, the method comprising:

measuring, using the current sensor, a current output by the DC power system over a prescribed time period to obtain a measured data set of current measurements;

demodulating the measured data set of current measurements to produce a demodulated current data set;

generating autocorrelation coefficients of the demodulated current data set over the prescribed time period;

determining a noise energy in the demodulated current data set based on a power of differenced autocorrelation coefficients of the demodulated current data set;

comparing noise energy in the demodulated current data set to a threshold value; and outputting an arc fault flag to the circuit protection device to trigger protective action when the comparison satisfies a prescribed criterion.

2. The method according to claim 1, wherein the step of demodulating the measured current produces a demodulated current data set that is independent of a switching frequency of the power system.

3. The method according to claim 1, wherein the step of demodulating the measured current removes a DC component and switching noise from the measured data set.

4. The method according to claim 1, wherein demodulating the measured data set of current measurements comprises:

time-shifting the measured data set of current measurements by a prescribed time period; and subtracting the time-shifted data set from the measured data set of current measurements to obtain a differenced data set of current measurements.

5. The method according to claim 4, further comprising:

obtaining a standard deviation of the differenced data set of current measurements;

comparing the standard deviation of the differenced data set of current measurements to a previously obtained standard deviation of current measurements; and setting a point in the demodulated current data set equal to the standard deviation of the differenced data set of current measurements when the standard deviation of the differenced data set of current measurements is less than the previously-obtained standard deviation of the differenced data set of current measurements.

6. The method according to claim 5, further comprising increasing the prescribed time period, and repeating the method for a predetermined number of iterations.

7. The method according to claim 1, wherein outputting the arc fault flag comprises one of outputting a visual indicator of the arc fault or an audible indication of the arc fault.

8. An arc fault detection device for detecting arc faults in direct current (DC) power system comprising a DC power source, a load, and a circuit protection device, comprising a processor in communication with memory storing instructions executable by the processor to:

obtain a measurement of a current output by the DC power system over a prescribed time period to obtain a measured data set of current measurements;

demodulate the measured data set of current measurements to produce a demodulated current data set;

generating autocorrelation coefficients of the demodulated current data set over the prescribed time period;

determining a noise energy in the demodulated current data set based on a power of differenced autocorrelation coefficients of the demodulated current data set;

compare the noise energy in the demodulated current data set to a threshold value;

output an arc fault flag to the circuit protection device to trigger protective action when the comparison satisfies a prescribed criterion, wherein the arc fault detection device is integrated within the circuit protection device or coupled thereto to directly control protective actions in the DC power system.

9. The arc fault detection device according to claim 8, wherein the memory further stores instructions to demodulate the measured current to produce a demodulated current data set that is independent of a switching frequency of the power system.

10. The arc fault detection device according to claim 8, wherein the memory further stores instructions to remove a DC component and switching noise from the measured data set.

11. The arc fault detection device according to claim 8, wherein the memory further stores instructions to:

time-shift the measured data set of current measurements by a prescribed time period; and subtract the time-shifted data set from the measured data set of current measurements to obtain a differenced data set of current measurements.

12. The arc fault detection device according to claim 8, wherein the memory further comprises instructions to:

obtain a standard deviation of the differenced data set of current measurements;

compare the standard deviation of the differenced data set of current measurements to a previously obtained standard deviation of current measurements; and set a point in the demodulated current data set equal to the standard deviation of the differenced data set of current measurements when the standard deviation of the differenced data set of current measurements is less than the previously-obtained standard deviation of the differenced data set of current measurements.

13. The arc fault detection device according to claim 8, wherein memory further stores instructions to output a visual indicator of the arc fault or output an audible indication of the arc fault.

14. The arc fault detection device according to claim 8, further comprising one of a power supply, a circuit disconnect device, or a circuit protection device, wherein the arc fault detection device is integrated within one of the power supply, the circuit disconnect device, or the circuit protection device.

15. The arc fault detection device according to claim 14, wherein the arc fault detection device is integrated in a power supply comprising an inverter.

16. The arc fault detection device according to claim 14, wherein the arc fault detection device is integrated in a circuit disconnect device comprising a switch.

17. The arc fault detection device according to claim 14, wherein the arc fault detection device is integrated in a circuit disconnect device in the form of a circuit breaker.

18. A non-transitory computer-readable medium comprising computer-executable instructions that, when executed by a processer, cause the processor to:

measure a current output by a DC power system over a prescribed time period to obtain a measured data set of current measurements;

demodulate the measured data set of current measurements to produce a demodulated current data set;

generate autocorrelation coefficients of the demodulated current data set over the prescribed time period;

determine a noise energy in the demodulated current data set based on a power of differenced autocorrelation coefficients of the demodulated current data set;

compare the noise energy in the demodulated current data set to a threshold value; and output an arc fault flag to a circuit protection device to trigger protective action when the comparison satisfies a prescribed criterion.

\* \* \* \* \*